(12) United States Patent
Shintani et al.

(10) Patent No.: US 8,077,255 B2
(45) Date of Patent: Dec. 13, 2011

(54) IMAGING APPARATUS

(75) Inventors: Dai Shintani, Osaka (JP); Kenichi Honjo, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/918,925

(22) PCT Filed: Feb. 20, 2009

(86) PCT No.: PCT/JP2009/000741
§ 371 (c)(1),
(2), (4) Date: Aug. 23, 2010

(87) PCT Pub. No.: WO2009/104416
PCT Pub. Date: Aug. 27, 2009

(65) Prior Publication Data
US 2011/0001871 A1   Jan. 6, 2011

(30) Foreign Application Priority Data
Feb. 22, 2008   (JP) ................................. 2008-041574

(51) Int. Cl.
*G02B 7/28*   (2006.01)

(52) U.S. Cl. ....................................... 348/360; 396/111

(58) Field of Classification Search ................. 396/111; 348/272, 294, 311, 360
See application file for complete search history.

(56) References Cited

U.S. PATENT DOCUMENTS

| 4,500,189 A | 2/1985 | Aoki |
| 6,346,694 B1 | 2/2002 | Kimba et al. |
| 6,816,199 B1 | 11/2004 | Ide |
| 2004/0042780 A1 | 3/2004 | Kindaichi et al. |
| 2006/0120710 A1* | 6/2006 | Nagano et al. ................ 396/111 |
| 2007/0269127 A1 | 11/2007 | Kusaka |

FOREIGN PATENT DOCUMENTS

| JP | 59-062809 | 4/1984 |
| JP | 10-161014 | 6/1998 |
| JP | 11-352394 | 12/1999 |
| JP | 2000-338393 | 12/2000 |
| JP | 2004-046132 | 2/2004 |
| JP | 2005-175976 | 6/2005 |
| JP | 2007-135140 | 5/2007 |
| JP | 2007-163545 | 6/2007 |
| JP | 2007-333720 | 12/2007 |

* cited by examiner

*Primary Examiner* — Clayton E Laballe
*Assistant Examiner* — Dennis Hancock
(74) *Attorney, Agent, or Firm* — McDermott Will & Emery LLP

(57) ABSTRACT

An imaging apparatus capable of performing phase difference detection while allowing light to enter an imaging device is provided. An imaging unit (1) includes an imaging device (10) including light receiving sections (11b, 11b, ...) and a substrate (11a) on which the light receiving sections (11b, 11b, ...) are provided and which has through holes (18a, 18a, ...). The imaging device (10) is configured to perform photoelectric conversion on received light. The imaging unit (1) further includes a phase difference detection unit (2) configured to perform phase difference detection on received light which has passed through the imaging device (10) via the through holes (18a, 18a, ...).

7 Claims, 23 Drawing Sheets

FIG. 22
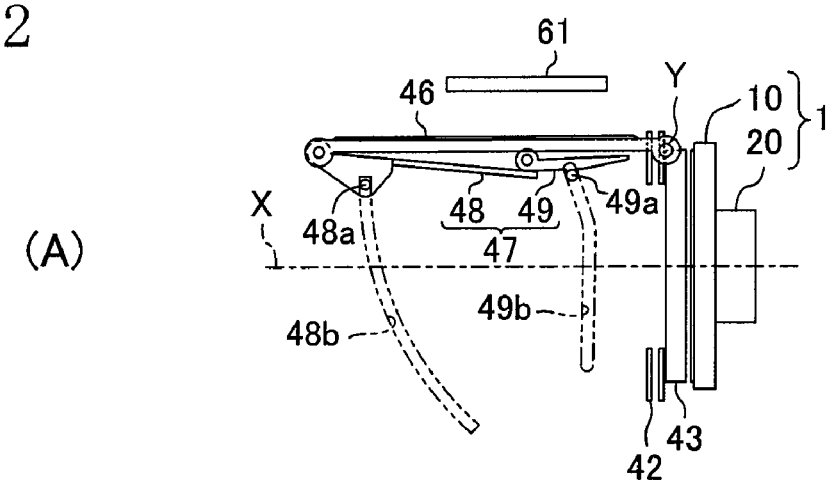
(A)
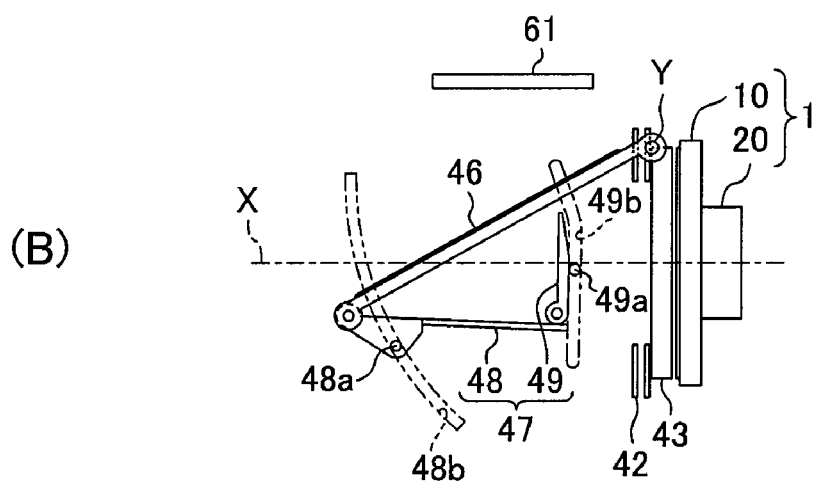
(B)
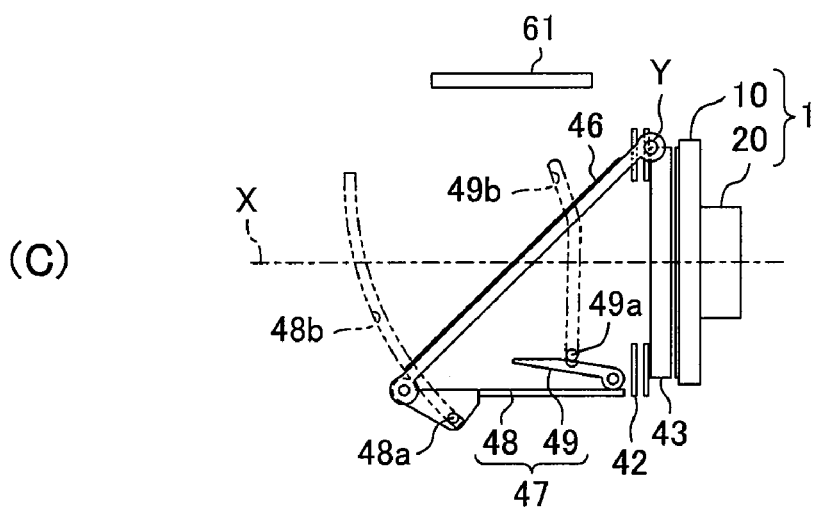
(C)

IMAGING APPARATUS

RELATED APPLICATIONS

This application is the U.S. National Phase under 35 U.S.C. §371 of International Application No. PCT/JP2009/000741, filed on Feb. 20, 2009, which in turn claims the benefit of Japanese Application No. 2008-041574, filed on Feb. 22, 2008, the disclosures of which Applications are incorporated by reference herein.

TECHNICAL FIELD

The present invention relates to an imaging apparatus including an imaging device for performing photoelectric conversion.

BACKGROUND ART

In recent years, digital cameras that convert an object image into an electrical signal using an imaging device such as a charge coupled device (CCD) image sensor and a complementary metal-oxide semiconductor (CMOS) image sensor, digitize the electrical signals, and record the obtained digital signals, have been widely used.

Single-lens reflex digital cameras include a phase difference detection section for detecting a phase difference between object images, and have the phase difference detection AF function of performing autofocus (hereinafter simply referred to as "AF") by the phase difference detection section. Since the phase difference detection AF function allows detection of a defocus direction and a defocus amount, the moving time of a focus lens can be reduced, thereby achieving fast-focusing (see, for example, PATENT DOCUMENT 1). In known single-lens reflex digital cameras, provided is a movable mirror capable of moving in or out of an optical path from a lens tube to an imaging device in order to lead light from an object to a phase difference detection section.

In so-called compact digital cameras, the autofocus function by video AF using an imaging device (see, for example, PATENT DOCUMENT 2) is employed. Therefore, in compact digital cameras, a mirror for leading light from an object to a phase difference detection section is not provided, thus achieving reduction in the size of compact digital cameras. In such compact digital cameras, autofocus can be performed with light incident on the imaging device. That is, it is possible to perform various types of processing using the imaging device, including, for example, obtaining an image signal from an object image formed on the imaging device to display the object image on an image display section provided on a back surface of the camera or to record the object image in a recording section, while performing autofocus. In general, this autofocus function by video AF advantageously has higher accuracy than that of phase difference detection AF.

CITATION LIST

Patent Document

PATENT DOCUMENT 1 Japanese Patent Publication No. 2007-163545
PATENT DOCUMENT 2: Japanese Patent Publication No. 2007-135140

SUMMARY OF THE INVENTION

Technical Problem

However, a defocus direction cannot be instantaneously detected by video AF. For example, when contrast detection AF is employed, a focus is detected by detecting a contrast peak, but a contrast peak direction, i.e., a defocus direction, cannot be detected unless a focus lens is shifted to back and forth from its current position, or the like. Therefore, it takes a long time to detect a focus.

In view of reducing the time required for detecting a focus, phase difference detection AF is more advantageous. However, in an imaging apparatus such as a single-lens reflex digital camera according to PATENT DOCUMENT 1, employing phase difference detection AF, a movable mirror has to be moved to be on an optical path from a lens tube to an imaging device in order to lead light from an object to a phase difference detection section. Thus, the imaging apparatus cannot perform various processes using the imaging device, while performing phase difference detection AF. In addition, even if the time necessary for detecting a focus with phase difference detection AF is reduced, it is necessary to move the movable mirror in switching the path of incident light between a path toward the phase difference detection section and a path toward the imaging device. This movement of the movable mirror disadvantageously causes a time lag.

It is therefore an object of the present invention to provide an imaging apparatus capable of detecting a phase difference while allowing light to enter an imaging device.

Solution to the Problem

An imaging apparatus according to the present invention includes: an imaging device including a light receiving section and a substrate on which the light receiving section is provided and which has a through hole, the imaging device being configured to perform photoelectric conversion on received light; and a phase difference detection section configured to perform phase difference detection on received light which has passed through the imaging device via the through hole.

ADVANTAGES OF THE INVENTION

According to the present invention, a through hole is formed in a substrate so that part of light which has entered the substrate is allowed to pass through an imaging device via the through hole, and is received by a phase difference detection section. As a result, it is possible to allow the phase difference detection section to perform phase difference detection, while allowing light to enter the imaging device.

BRIEF DESCRIPTION OF THE DRAWINGS

FIG. 22 is a view for describing configurations of a quick return mirror and a light shield plate. FIG. 22(A) shows the quick return mirror in a retreat position, FIG. 22(B) shows the quick return mirror positioned between the retreat position and a reflection position, and FIG. 22(C) shows the quick return mirror in the reflection position.

Figure 1:
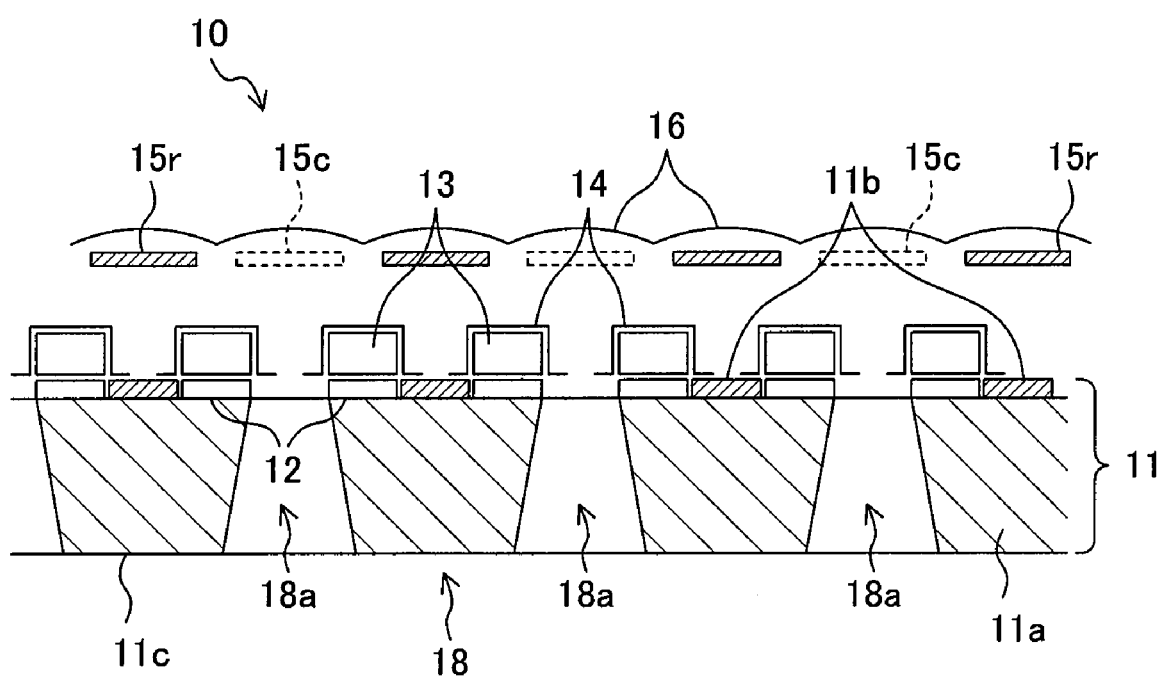
FIG. 1 is a cross-sectional view of an imaging device according to a first embodiment of the present invention.

DESCRIPTION OF REFERENCE CHARACTERS 1, 301 imaging unit (imaging apparatus)
10, 210 imaging device
11a, 211a substrate
11b light receiving section
15r, 15g, 15b color filter
18a through hole
20, 320 phase difference detection unit (phase difference detection section)
21a, 321a condenser lens
23a, 323a separator lens
24a, 324a line sensor (sensor)
100, 200 camera (imaging apparatus)
5 body control section (control section)

DESCRIPTION OF EMBODIMENTS

Embodiments of the present invention will be specifically described hereinafter with reference to the drawings.

First Embodiment

Figure 2:
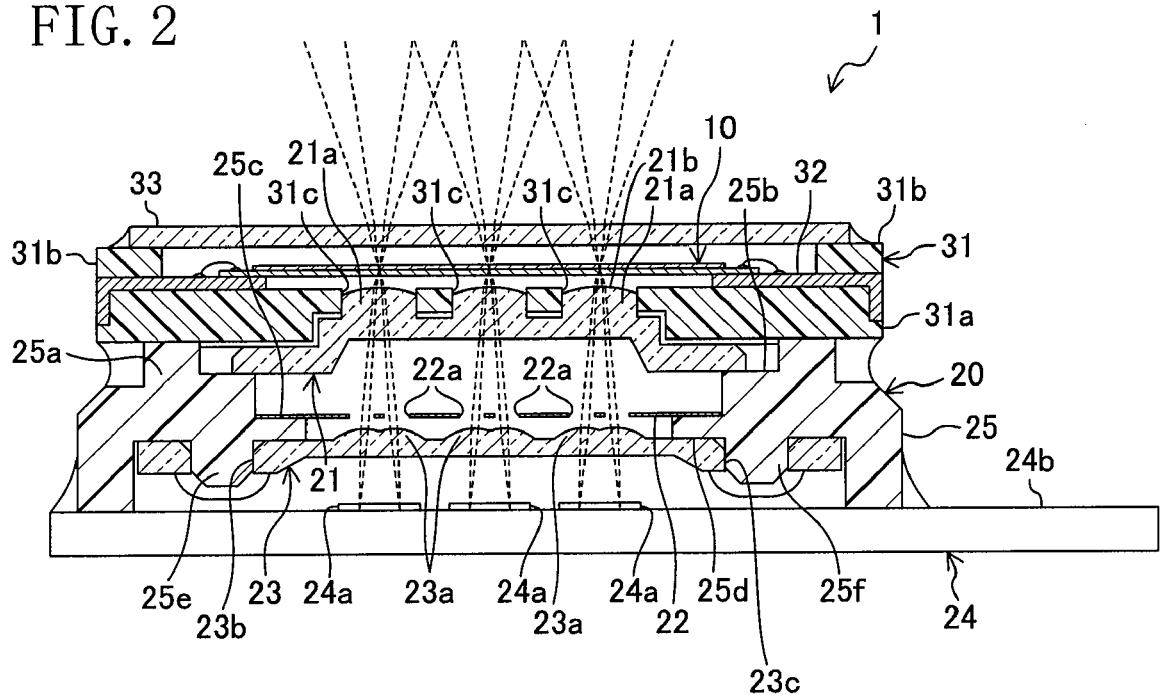
FIG. 2 is a cross-sectional view of an imaging unit.

FIG. 2 illustrates an imaging unit 1 as an imaging apparatus according to the present invention. The imaging unit 1 includes: an imaging device 10 for converting an object image into an electrical signal; a package 31 for holding the imaging device 10; and a phase difference detection unit 20 for performing focus detection using a phase difference detection method.

The imaging device 10 is an interline type CCD image sensor and, as shown in FIG. 1, includes a photoelectric conversion section 11 made of a semiconductor material, vertical registers 12, transfer paths 13, masks 14, filters 15, and microlenses 16.

The photoelectric conversion section 11 includes a substrate 11a and a plurality of light receiving sections (also referred to as "pixels") 11b, 11b, . . . arranged on the substrate 11a.

The substrate 11a is a Si (silicon)-based substrate. Specifically, the substrate 11a is a Si single crystal substrate or a silicon-on-insulator (SOI) wafer. In particular, an SOI substrate has a sandwich structure of a $SiO_2$ thin film and Si thin films, and chemical reaction can be stopped at the $SiO_2$ film in etching or like processing. Thus, in terms of performing stable substrate processing, it is advantageous to use an SOI substrate.

Figure 4:
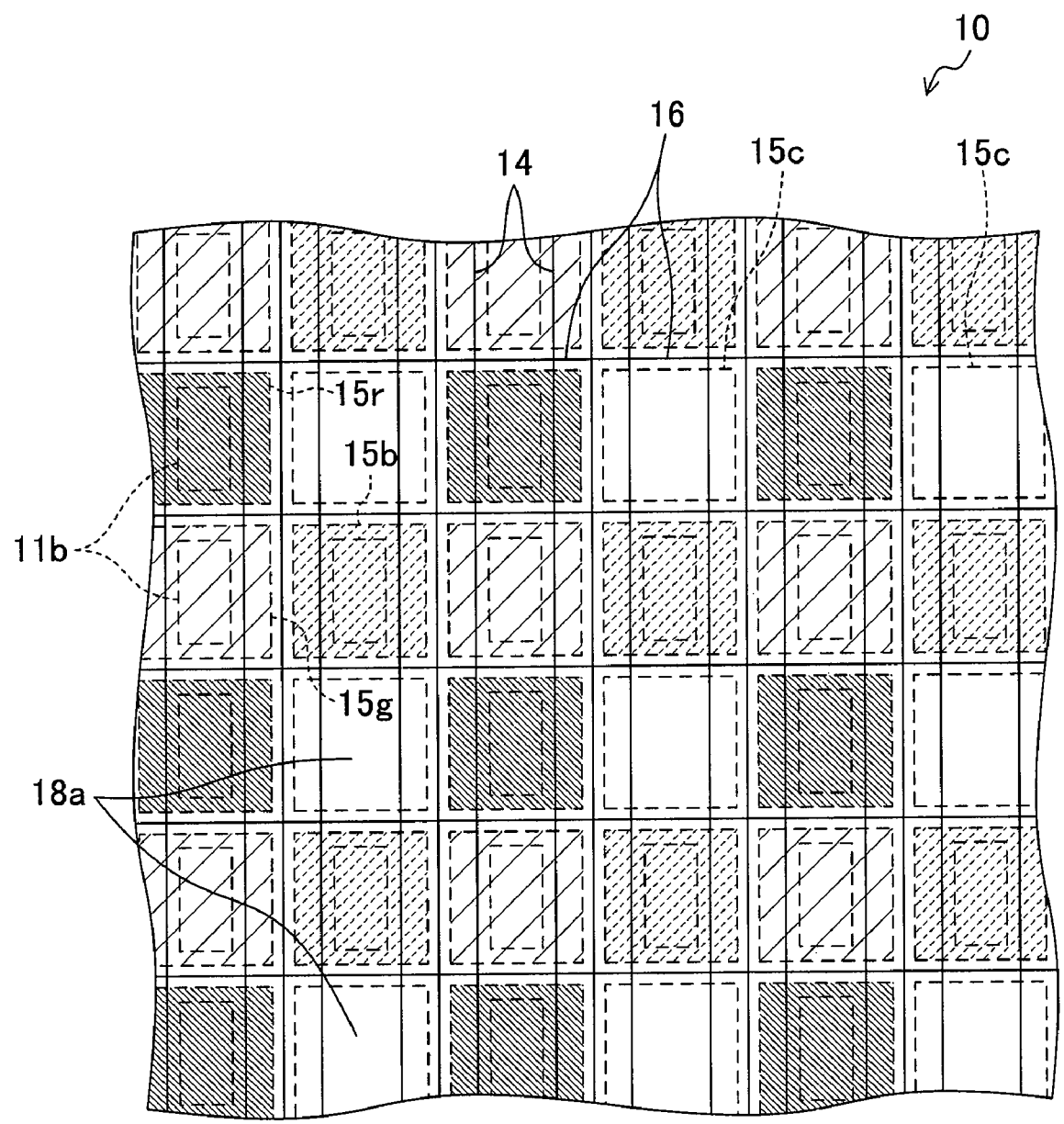
FIG. 4 is a plan view of the imaging device.

Each of the light receiving sections 11b is made of a photodiode, and absorbs light to generate electrical charge. The light receiving sections 11b, 11b, . . . are respectively provided in micro pixel regions each having a square shape and arranged in a matrix on the substrate 11a (see, FIG. 4).

Figure 3:
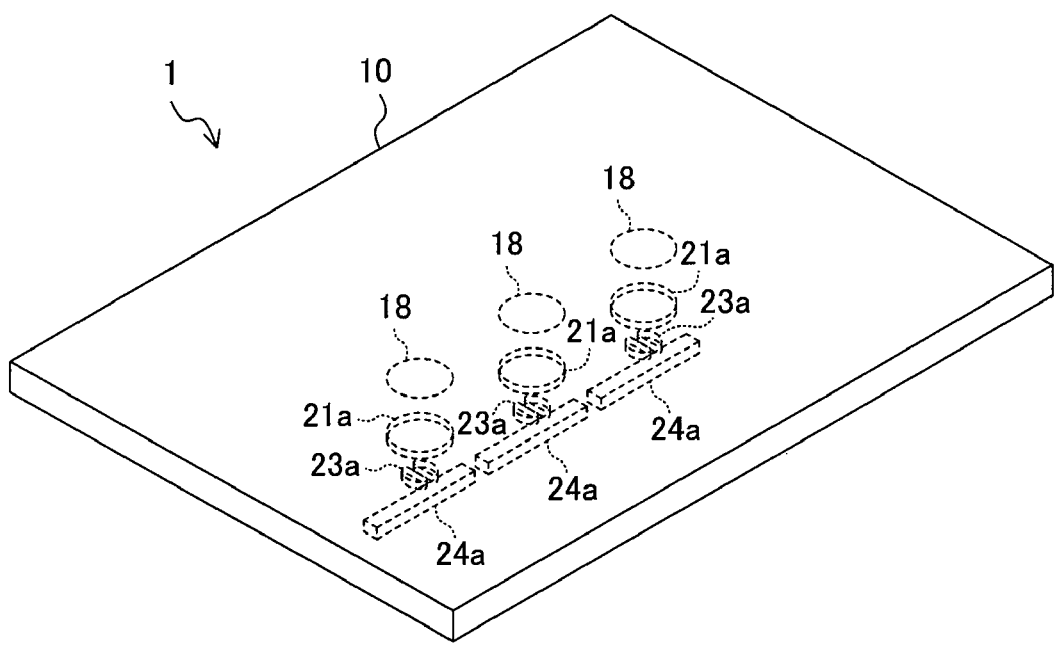
FIG. 3 is a perspective view of the imaging unit.

As illustrated in FIG. 3, light passing portions 18, 18, . . . through which irradiated light passes are formed in the substrate 11a. As illustrated in FIG. 1, each of the light passing portions 18 is made of a plurality of through holes 18a, 18a, . . . penetrating the substrate 11a along the thickness of the substrate 11a. In other words, the through holes 18a, 18a, . . . are formed for each of the light passing portions 18 in the substrate 11a. These through holes 18a, 18a, . . . are formed by cutting or etching the surface (hereinafter also referred to as the "back surface") of the substrate 11a opposite to the surface thereof on which the light receiving sections 11b are provided.

More specifically, assuming that four pixel regions arranged adjacent to one another in two rows and two columns are a repeat unit in the pixel regions arranged in rows and columns on the substrate 11a, the light receiving sections 11b, 11b, and 11b are arranged in three of the four pixel regions, and the through hole 18a is formed in the other one pixels region.

The vertical registers 12 are respectively provided for the light receiving sections 11b, and serve to temporarily store electrical charge stored in the light receiving sections 11b. Specifically, the electrical charge stored in the light receiving sections 11b is transferred to the vertical registers 12. The electrical charge transferred to the vertical registers 12 is transferred to a horizontal register (not shown) via the transfer paths 13, and then, to an amplifier (not shown). The electrical charge transferred to the amplifier is amplified and pulled out as an electrical signal.

The masks 14 are provided so that the light receiving sections 11b are exposed toward an object and the masks 14 cover the vertical registers 12 and the transfer paths 13 to prevent light from entering the vertical registers 12 and the transfer paths 13.

Each of the filters 15 and an associated one of the microlenses 16 are provided in each micro pixel region having a square shape.

The microlenses 16 collect light to cause the light to enter the light receiving sections 11b. The light receiving sections 11b can be efficiently irradiated with light by the microlenses 16. Although the microlenses 16 are provided in pixel regions associated with the through holes 18a, but do not have to be provided in these pixel regions.

The filters 15 include: transparent filters 15c through which various types of light is transmitted, irrespective of the type of colors; and color filters 15r, 15g, and 15b through each of which light of only a specific color is transmitted.

In the imaging device 10, the color filters 15r, 15g, and 15b are arranged in a so-called Bayer pattern in a region where no light passing portions 18 are provided. Specifically, in the above-described repeat unit in which four pixel regions are arranged adjacent to one another in two rows and two columns, two green color filters (i.e., color filters having a higher transmittance in a green visible light wavelength range than in the other color visible light wavelength ranges) 15g and 15g are arranged in a diagonal direction, and a red color filter (i.e., a color filter having a higher transmittance in a red visible light wavelength range than in the other color visible light wavelength ranges) 15r, and a blue color filter (i.e., a color filter having a higher transmittance in a blue visible light wavelength range than in the other color visible light wavelength ranges) 15b are arranged in another diagonal direction.

On the other hand, in the imaging device 10, the transparent filters 15c and the color filters 15r, 15g, and 15b are mixed in regions where the light passing portions 18 are provided. Specifically, as illustrated in FIG. 1, in the repeat unit, the color filters 15r, 15g, and 15b are provided in three pixel regions including the light receiving sections 11b, 11b, and 11b, whereas the transparent filter 15c is provided in the other pixel region including the through hole 18a.

More specifically, in four pixel regions in the repeat unit, the transparent filter 15c is provided in the pixel region including the through hole 18a, the green color filter 15g is provided in the pixel region diagonal to the pixel region including the through hole 18a, the red color filter 15r is provided in one of the pixel regions respectively adjacent, in the row and column directions, to the pixel region including the through hole 18a, and the blue color filter 15b is located in the other pixel region. In other words, in so-called Bayer primary color filters, one of generally two green color filters among four color filters adjacent to one another in two rows and two columns is removed so as to obtain an optically transparent state.

In this manner, three light receiving sections 11b, 11b, and 11b adjacent to one another in two rows and two columns, one through hole 18a, color filters 15r, 15g, and 15b, and a transparent filter 15c are regularly arranged on the substrate 11a.

In the thus-configured imaging device 10, light collected by the microlenses 16, 16, . . . enters the color filters 15r, 15g, and 15b and the transparent filters 15c. Only part of the light which has entered the color filters 15r, 15g, and 15b and having a color associated with each of the filters is transmitted through the filter, and is applied on the light receiving sections 11b, 11b, . . . . On the other hand, light which has entered the transparent filters 15c passes through the transparent filters 15c, and then passes through the substrate 11a via the through holes 18a. The inner surface of each of the through holes 18a has an angle at which light reflected on this inner surface while passing through the through hole 18a does not travel to the phase difference detection unit 20. This configuration can prevent a non-real image from being formed on a line sensor 24a, which will be described later.

Each of the light receiving sections 11b irradiated with light which has passed through the color filters absorbs light to generate electrical charge. The electrical charge generated by the light receiving sections 11b is transferred to the amplifier via the vertical registers 12 and the transfer paths 13, and is output as an electrical signal. That is, the amount of received light having a color corresponding to each color filter is obtained from each of the light receiving sections 11b, 11b, . . . as an output.

Thus, the imaging device 10 performs photoelectric conversion at the light receiving sections 11b, 11b, . . . provided throughout the entire imaging plane, thereby converting an object image formed on the imaging plane into an electrical signal.

The imaging device 10 configured in the above-described manner is held in the package 31 (see, FIG. 2). The package 31 forms a holding portion.

Specifically, the package 31 includes a flat bottom plate 31a provided with a frame 32, and upright walls 31b, 31b, . . . provided in four directions. The imaging device 10 is mounted on the frame 32 so as to be surrounded by the upright walls 31b, 31b, . . . in four directions, and is electrically connected to the frame 32 via bonding wires.

Moreover, a cover glass 33 is attached to ends of the upright walls 31b, 31b, . . . of the package 31 so as to cover the imaging plane (i.e., the surface on which the light receiving sections 11b, 11b, . . . are provided) of the imaging device 10. The imaging plane of the imaging device 10 is protected by the cover glass 33 from attachment of dust and the like.

In this case, the same number of openings 31c, 31c, . . . as the number of the light passing portions 18, 18, . . . are formed in the bottom plate 31a of the package 31 so as to penetrate the bottom plate 31a and to be located at positions respectively corresponding to the light passing portions 18, 18, . . . of the imaging device 10. With these openings 31c, 31c, . . . light which has passed through the imaging device 10 reaches the phase difference detection unit 20, which will be described later. The openings 31c form light passing portions.

In the bottom plate 31a of the package 31, the openings 31c do not have to be necessarily formed so as to penetrate the bottom plate 31a. That is, as long as light which has passed through the imaging device 10 can reach the phase difference detection unit 20, a configuration in which transparent portions or semi-transparent portions are formed in the bottom plate 31a, or a similar configuration may be employed.

The phase difference detection unit 20 is provided to the back surface (i.e., an opposite surface to a surface facing an object) of the imaging device 10, and receives light which has passed through the imaging device 10 to perform phase difference detection. Specifically, the phase difference detection unit 20 converts the received light into an electrical signal for use in distance measurement. The phase difference detection unit 20 forms a phase difference detection section.

Figure 5:
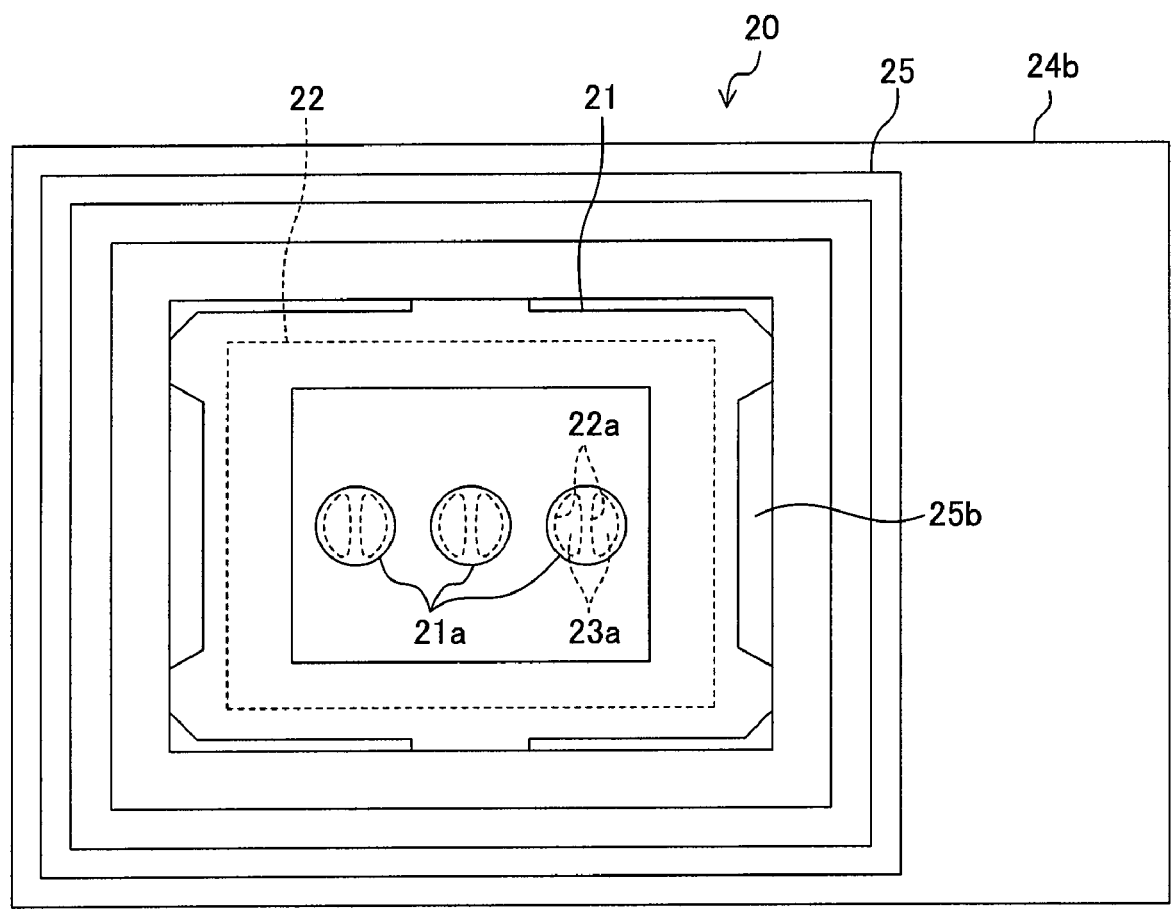
FIG. 5 is a plan view of a phase difference detection unit.

As shown in FIGS. 2 and 5, the phase difference detection unit 20 includes: a condenser lens unit 21; a mask member 22; a separator lens unit 23; a line sensor unit 24; and a module frame 25 for attaching the condenser lens unit 21, the mask member 22, the separator lens unit 23, and the line sensor unit 24. The condenser lens unit 21, the mask member 22, the separator lens unit 23, and the line sensor unit 24 are arranged in this order from the imaging device 10 along the thickness of the imaging device 10.

The plurality of condenser lenses 21a, 21a, . . . integrated into a single unit form the condenser lens unit 21. The same number of the condenser lenses 21a, 21a, . . . as the number of the light passing portions 18, 18, . . . are provided. Each of the condenser lenses 21a collects incident light. The condenser lenses 21a collect light which has passed through the imaging device 10 and is spreading out therein, and guide the light to separator lenses 23a of the separator lens unit 23, which will be described later. Each of the condenser lenses 21a is formed into a circular column shape, and an incident surface 21b of the condenser lens 21a has a convex shape.

Since an incident angle of light entering each of the separator lenses 23a is reduced by providing the condenser lenses 21a, an aberration of the separator lenses 23a can be reduced, and a distance between object images on the line sensor 24a which will be described later can be reduced. As a result, the size of each of the separator lenses 23a and the line sensor 24a can be reduced. In addition, when a focus position of an object image from the imaging optical system greatly diverges from the imaging unit 1 (specifically, greatly diverges from the imaging device 10 of the imaging unit 1), the contrast of the image remarkably decreases. In this embodiment, however, due to the size-reduction effect of the condenser lenses 21a and the separator lenses 23a, reduction in contrast can be prevented, so that a focus detection range can be increased. If highly accurate phase difference detection around a focus position is performed, or if the separator lenses 23a, the line sensors 24a, and the like have sufficient dimensions, the condenser lens unit 21 does not have to be provided.

The mask member 22 is provided between the condenser lens unit 21 and the separator lens unit 23. In the mask member 22, two mask openings 22a, 22a are formed in a part thereof corresponding to each of the separator lenses 23a. That is, the mask member 22 divides a lens surface of each of the separator lenses 23a into two areas, so that only the two areas are exposed toward the condenser lenses 21a. More specifically, the mask member 22 performs pupil division to divide light collected by each condenser lens 21a into two light bundles and causes the two light bundles to enter the separator lens 23a. The mask member 22 can prevent harmful light from one of adjacent two of the separator lenses 23a from entering the other one of the adjacent two separator lenses 23a. Note that the mask member 22 does not have to be provided.

The separator lens unit 23 includes a plurality of separator lenses 23a, 23a, . . . . In other words, the separator lenses 23a, 23a, . . . are integrated into a single unit to form the separator lens unit 23. In the same manner as that for the condenser lenses 21a, 21a, . . . , the same number of the separator lenses 23a, 23a, . . . as the number of the light passing portions 18, 18, . . . are provided. Each of the separator lenses 23a forms two identical object images on, the line sensor 24a from two light bundles which have passed through the mask member 22 and has entered the separator lens 23a.

The line sensor unit 24 includes a plurality of line sensors 24a, 24a, . . . and a mounting portion 24b on which the line sensors 24a, 24a, . . . are mounted. In the same manner as for the condenser lenses 21a, 21a, . . . the same number of the line sensors 24a, 24a, . . . as the number of the light passing portions 18, 18, . . . are provided. Each of the line sensors 24a receives a light image to be formed on an imaging plane, and converts the image into an electrical signal. That is, a distance between the two object images can be detected from an output of the line sensor 24a, and a shift amount (i.e., a defocus amount: Df amount) of a focus of an object image to be formed on the imaging device 10 and the direction (i.e., the defocus direction) in which the focus is shifted can be obtained, based on the distance. The Df amount, the defocus direction, and the like will also be referred to as "defocus information" hereinafter.

The condenser lens unit 21, the mask member 22, the separator lens unit 23, and the line sensor unit 24, configured in the above-described manner, are provided within the module frame 25.

The module frame 25 is a member formed to have a frame shape, and an attachment portion 25a is provided along an inner periphery of the module frame 25 so as to protrude inwardly. On one side of the attachment portion 25a facing the imaging device 10, a first attachment portion 25b and a second attachment portion 25c are formed in a stepwise manner. On the other side of the attachment portion 25a, which is opposite side to the side facing the imaging device 10, a third attachment portion 25d is formed.

The mask member 22 is attached to a side of the second attachment portion 25c of the module frame 25 located closer to the imaging device 10, and the condenser lens unit 21 is attached to the first attachment portion 25b. As shown in FIGS. 2 and 5, the condenser lens unit 21 and the mask member 22 are formed so that a peripheral portion of each of the condenser lens unit 21 and the mask member 22 fits in the module frame 25 when being attached to the first attachment portion 25b and the second attachment portion 25c, and thus, the condenser lens unit 21 and the mask member 22 are positioned relative to the module frame 25.

The separator lens unit 23 is attached to a side of the third attachment portion 25d of the module frame 25 located opposite to the imaging device 10. The third attachment portion 25d is provided with positioning pins 25e and direction reference pins 25f, each of which protrudes in an opposite direction to the condenser lens unit 21. The separator lens unit 23 is provided with positioning holes 23b and direction reference holes 23c respectively corresponding to the positioning pins 25e and the direction reference pins 25f. The diameters of the positioning pins 25e and the positioning holes 23b are determined so that the positioning pins 25e fit in the positioning holes 23b. On the other hand, the diameters of the direction reference pins 25f and the direction reference holes 23c are determined so that the direction reference pins 25f loosely fit in the direction reference holes 23c. That is, the attitude of the separator lens unit 23 such as the direction in which the separator lens unit 23 is attached to the third attachment portion 25d is defined by respectively inserting the positioning pins 25e and the direction reference pins 25f of the third attachment portion 25d in the positioning holes 23b and the direction reference holes 23c, and the position of the separator lens unit 23 is determined relative to the third attachment portion 25d by providing a close fit of the positioning pins 25e with the positioning holes 23b. Thus, when the attitude and position of the separator lens unit 23 are determined and the separator lens unit 23 is attached, the lens surface of each of the separator lenses 23a, 23a, . . . is directed toward the condenser lens unit 21, and faces an associated one of the mask openings 22a, 22a.

In the above-described manner, the condenser lens unit 21, the mask member 22, and the separator lens unit 23 are attached to the module frame 25, while being held at determined positions. That is, the positional relationship among the condenser lens unit 21, the mask member 22, and the separator lens unit 23 is determined by the module frame 25.

Then, the line sensor unit 24 is attached to the module frame 25 from the back side (which is an opposite side to the side facing the condenser lens unit 21) of the separator lens unit 23. In this case, the line sensor unit 24 is attached to the module frame 25, while being held in a position which allows light transmitted through each of the separator lenses 23*a* to enter an associated one of the line sensors 24*a*.

In above-described manner, the condenser lens unit 21, the mask member 22, the separator lens unit 23, and the line sensor unit 24 are attached to the module frame 25, and thus, the condenser lenses 21*a*, 21*a*, . . . the mask member 22, the separator lenses 23*a*, 23*a*, . . . and the line sensor 24*a*, 24*a*, . . . are arranged so as to be located at determined positions so that light incident on the condenser lenses 21*a*, 21*a*, . . . is transmitted through the condenser lenses 21*a*, 21*a*, . . . to enter the separator lenses 23*a*, 23*a*, . . . via the mask member 22, and then, light which has been transmitted through the separator lenses 23*a*, 23*a*, . . . forms an image on each of the line sensors 24*a*, 24*a*, . . . .

The imaging device 10 and the phase difference detection unit 20 configured in the above-described manner are joined together. Specifically, the imaging device 10 and the phase difference detection unit 20 are configured such that the openings 31*c* of the package 31 in the imaging device 10 closely fit the condenser lenses 21*a* in the phase difference detection unit 20. That is, with the condenser lenses 21*a*, 21*a*, . . . in the phase difference detection unit 20 respectively inserted in the openings 31*c*, 31*c*, . . . of the package 31 in the imaging device 10, the module frame 25 is bonded to the package 31. Thus, the imaging device 10 and the phase difference detection unit 20 are joined together while being held in the positions relative to each other. As described above, the condenser lenses 21*a*, 21*a*, . . . , the separator lenses 23*a*, 23*a*, . . . , and the line sensors 24*a*, 24*a*, . . . are integrated into a single unit, and then are attached as a signal unit to the package 31.

The imaging device 10 and the phase difference detection unit 20 may be configured such that all of the openings 31*c*, 31*c*, . . . closely fit all the condenser lenses 21*a*, 21*a*, . . . . Alternatively, the imaging device 10 and the phase difference detection unit 20 may be also configured such that only some of the openings 31*c*, 31*c*, . . . closely fit associated ones of the condenser lenses 21*a*, 21*a*, . . . , and the rest of the openings 31*c*, 31*c*, . . . loosely fit associated ones of the condenser lenses 21*a*, 21*a*, . . . . In the latter case, the imaging device 10 and the phase difference detection unit 20 are preferably configured such that one of the condenser lenses 21*a* and one of the openings 31*c* located closest to the center of the imaging plane closely fit each other to determine positions in the imaging plane, and furthermore, one of the condenser lenses 21*a* and one of the openings 31*c* located most distant from the center of the imaging plane closely fit each other to determine peripheral positions (i.e., rotation angles) of the condenser lens 21*a* and the opening 31*c* which are located at the center of the imaging plane.

As a result of connecting the imaging device 10 and the phase difference detection unit 20, the condenser lens 21*a*, a pair of the mask openings 22*a*, 22*a* of the mask member 22, the separator lens 23*a*, and the line sensor 24*a* are arranged in the back side of the substrate 11*a* to correspond to each of the light passing portions 18.

The operation of the imaging unit 1 configured in the above-described manner will be described hereinafter.

When light enters the imaging unit 1 from an object, the light is transmitted through the cover glass 33, and enters the imaging device 10. The light is collected by the microlenses 16 of the imaging device 10, and then, is transmitted through the color filters 15, so that only light of a specific color reaches the light receiving sections 11*b*. The light receiving sections 11*b* absorb light to generate electrical charge. The generated electrical charge is transferred to the amplifier via the vertical registers 12 and the transfer paths 13, and is output as an electrical signal. In this manner, each of the light receiving sections 11*b* converts light into an electrical signal throughout the entire imaging plane, and thereby, the imaging device 10 converts an object image formed on the imaging plane into an electrical signal for generating an image signal.

In the light passing, portions 18, 18, . . . part of light applied to the imaging device 10 passes through the imaging device 10 via the through holes 18*a*, 18*a*, . . . . The light which has passed through the imaging device 10 enters the condenser lenses 21*a*, 21*a*, which closely fit the openings 31*c*, 31*c*, . . . of the package 31. The light which has been collected after being transmitted through each of the condenser lenses 21*a* is divided into two light bundles when passing through each pair of mask openings 22*a*, 22*a* formed in the mask member 22, and then, enters each of the separator lenses 23*a*. Light subjected to pupil division is transmitted through the separator lens 23*a* and identical object images are formed on two positions on the line sensor 24*a*. As the photoelectric conversion section 11 does, the line sensor 24*a* performs photoelectric conversion on the amount of light received by each light receiving section to generate an electrical signal, and then outputs the electrical signal. That is, the imaging device 10 is configured such that only light which has passed through a plurality of through holes 18*a*, 18*a*, . . . enters one condenser lens 21*a*, one separator lens 23*a*, and one single line sensor 24*a*.

The imaging device 10 is connected to a control section (not shown in this embodiment, and corresponding to, for example, a body control section 5 of a second embodiment, which will be described later) for performing processing on the electrical signal from the imaging device 10 and generating an image signal. In this embodiment, the control section is not provided in the imaging unit 1, but may be provided in the imaging unit 1.

The control section obtains an object image formed on the imaging plane as an electrical signal by obtaining positional information on each of the light receiving sections 11*b* and output data corresponding to the amount of received light in this light receiving section 11*b*.

In this case, in the light receiving sections 11*b*, 11*b*, . . . , even when the same amount of light is received, the amount of accumulated electrical charge differs among different wavelengths of light. Thus, output data from the light receiving sections 11*b*, 11*b*, . . . of the imaging device 10 is corrected according to the types of the color filters 15*r*, 15*g*, and 15*b* respectively provided to the light receiving sections 11*b*, 11*b*, . . . . For example, a correction amount for each pixel is determined so that outputs of the R pixel 11*b*, the G pixel 11*b*, and the B pixel 11*b* become at the same level when each of the R pixel 11*b* to which the red color filter 15*r* is provided, the G pixel 11*b* to which the green color filter 15*g* is provided, and the B pixel 11*b* to which the blue color filter 15*b* is provided receives the same amount of light corresponding to the color of each color filter.

Further, in this embodiment, the light receiving sections 11*b* cannot be provided in regions of the light passing portions 18 where the through holes 18*a* are formed, and thus, output in the light passing portions 18, 18, . . . decreases.

To prevent this decrease, the control section performs interpolation on pixels associated with the through holes 18*a* using output data of the pixels 11*b*, 11*b*, . . . adjacent to the through holes 18*a*. Specifically, interpolation (standard interpolation) of a color signal of green of a colorless pixel 11*b* is performed using the average value of outputs of four G pixels 11*b*, 11*b*, . . . diagonally adjacent to the colorless pixel 11*b*. Alternatively, in the four G pixels 11b, 11b, . . . each of which is located diagonally adjacent to the colorless pixel 11b, change in output of one pair of the G pixels 11b, 11b adjacent to each other in one diagonal direction is compared to change in output of the other pair of the G pixels 11b, 11b adjacent to each other in the other diagonal direction, and then, interpolation (slope interpolation) of a color signal of green of the colorless pixel 11b is performed using the average value of outputs of the pair of the G pixels 11b, 11b located diagonally adjacent whose change in output is larger, or the average value of outputs of the pair of the G pixels 11b, 11b located diagonally adjacent whose change in output is smaller. Assume that a pixel desired to be interpolated is an edge of a focus object. If interpolation is performed using the pair of the light receiving sections 11b, 11b whose change in output is larger, the edge is undesirably caused to be loose. Therefore, the pair of the light receiving sections 11b, 11b whose change in output is smaller is used when each of the changes is larger than or equal to a predetermined threshold, and the pair of the light receiving sections 11b, 11b whose change in output is larger is used when each of the changes is smaller than the predetermine threshold so that as small change rate (slope) as possible is employed.

Then, the control section generates an image signal made of brightness information and color information.

For example, the control section obtains brightness information on each of the pixels 11b by multiplying output data of each pixel 11b (including pixels associated with the through holes 18a, and the same hereinafter) by a predetermined coefficient. In addition, the control section interpolates color information on each pixel 11b using output data of adjacent pixels 11b, 11b, . . . around the pixel 11b. More specifically, output data of each pixel 11b is the amount of received light of specific one of red, green, and blue. Thus, based on output data obtained from the pixels 11b, 11b, . . . , the control section interpolates output data of the other two colors which are not present in each pixel 11b. Consequently, red, green, and blue output data is generated for each pixel 11b. Since output data of the three colors includes brightness information, color information including no brightness information can be generated by subtracting brightness information for each pixel 11b obtained in the manner described above from output data of the associated color. In this manner, the control section obtains brightness information and color information for each pixel 11b.

If it is not necessary to distinguish brightness information from color information, image processing may be performed using color information including brightness information.

Further, the control section performs different image processings for brightness information and color information obtained for each pixel 11b, and eventually, an image signal is generated by synthesizing the brightness information with the color information.

The color space in processing by the control section is not limited to RGB, and may be converted, by, for example, Lab conversion, into another color space to perform processing.

In this manner, an image signal of an object image formed on the imaging plane of the imaging device 10 is obtained.

By correcting and interpolating an output from the imaging device 10 in the manner described above, an image signal of an object image can be properly captured even by the imaging device 10 provided with the light passing portions 18, 18, . . . .

An electrical signal output from the line sensor unit 24 is also input to the control section. The control section may be identical to, or different from, the control section of the imaging device 10. The control section can obtain the distance between two object images formed on the line sensor 24a, based on the output from the line sensor unit 24, and then, can detect a focus state of an object image formed on the imaging device 10 from the obtained distance. For example, when two object images are correctly formed on the imaging device 10 (i.e., in focus) after being transmitted through an imaging lens, the two object images are located at predetermined reference positions with a predetermined reference distance therebetween. In contrast, when object images are formed before the imaging device 10 in the optical axis direction (i.e., front focus), the distance between the object images is smaller than the reference distance when the object images are in focus. When object images are formed behind the imaging device 10 in the optical axis direction (i.e., back focus), the distance between the two object images is larger than the reference distance when the object image is in focus. That is, an output from the line sensor 24a is amplified, and then, operation by an arithmetic circuit obtains information regarding whether an object image is in focus or not, whether the object is in front focus or back focus, and the Df amount.

Accordingly, in this embodiment, the through holes 18a, 18a, . . . formed in the substrate 11a can increase the passage rate of light which passes through the imaging device 10. As a result, phase difference detection can be precisely performed by the phase difference detection unit 20.

In addition, since no color filters are provided in portions corresponding to the through holes 18a, 18a, . . . , attenuation of light can be reduced, thereby further increasing the passage rate of light which passes through the imaging device 10.

Further, in the foregoing configuration, a plurality of sets of the condenser lens 21a, the separator lens 23a, and the line sensor 24a are provided. Each of the above sets receives not only light which has passed through one through hole 18a but also light which has passed through a plurality of through holes 18a, 18a, . . . . As a result, a focus state can be accurately detected.

Furthermore, light from the plurality of through holes 18a, 18a, . . . enters a single set of the condenser lens 21a, the separator lens 23a, and the line sensor 24a. This configuration is advantageous because the size of the set of the condenser lens 21a, the separator lens 23a, and the line sensor 24a is not restricted by the size of pixels. That is, advantageously, the size of one set of the condenser lens 21a, the separator lens 23a, and the line sensor 24a does not cause any problem in increasing the resolution of the imaging device 10 by reducing the size of pixels.

Moreover, an output of a pixel associated with the position of a through hole 18a is interpolated using an output of the light receiving sections 11b, 11b, . . . adjacent to this through hole 18a. Then, it is possible to prevent a captured image based on an output of the light passing section 18 including the through holes 18a, 18a, . . . from being dark.

In addition, in relation to the imaging device 10 configured to allow light to pass therethrough, the openings 31c, 31c, . . . are formed in the bottom plate 31a of the package 31 for housing the imaging device 10, and thereby, light which has passed through the imaging device 10 is easily allowed to reach the back side of the package 31. In addition, the phase difference detection unit 20 is disposed in the back side of the package 31, and thus, a configuration in which light which has passed through the imaging device 10 is received at the phase difference detection unit 20 can be easily obtained.

As long as light which has passed through the imaging device 10 can pass through the openings 31c, 31c, . . . formed in the bottom plate 31a of the package 31 toward the back side of the package 31, any configuration can be employed. However, by forming the openings 31c, 31c, . . . as through holes, it is possible to allow light which has passed through the imaging device 10 to reach the back side of the package 31 without attenuating the light.

With the condenser lenses 21*a*, 21*a*, . . . provided so as to closely fit the openings 31*c*, 31*c*, . . . , positioning of the phase difference detection unit 20 relative to the imaging device 10 can be performed using the openings 31*c*, 31*c*, . . . . When the condenser lenses 21*a*, 21*a*, . . . are not provided, the separator lenses 23*a*, 23*a*, . . . may be configured to closely fit the openings 31*c*, 31*c*, . . . . Thus, positioning of the phase difference detection unit 20 relative to the imaging device 10 can be performed in the same manner.

In addition, the condenser lenses 21*a*, 21*a*, . . . can be provided so as to penetrate the bottom plate 31*a* of the package 31 to approach the substrate 11*a*. Thus, the imaging unit 1 can be configured as a compact size imaging unit.

In this embodiment, the through holes 18*a* are formed only in the light passing portions 18. However, the configuration is not limited thereto. For example, the through holes 18*a* may be formed in the entire substrate 11*a*. However, formation of the through holes 18*a* does not allow the light receiving sections 11*b* to be provided, and reduces an output of the imaging device 10. Thus, the through holes 18*a* are preferably formed in necessary regions.

In this embodiment, transparent filters are provided in pixel regions in which the through holes 18*a* are formed. However, no transparent filters may be provided. That is, instead of transparent filters, a material, such as resin, constituting the microlenses 16 may fill the pixel regions.

Further, the color filters 15*r*, 15*g*, and 15*b* are not limited to primary color filters, and may be complementary color filters, for example.

Figure 6:
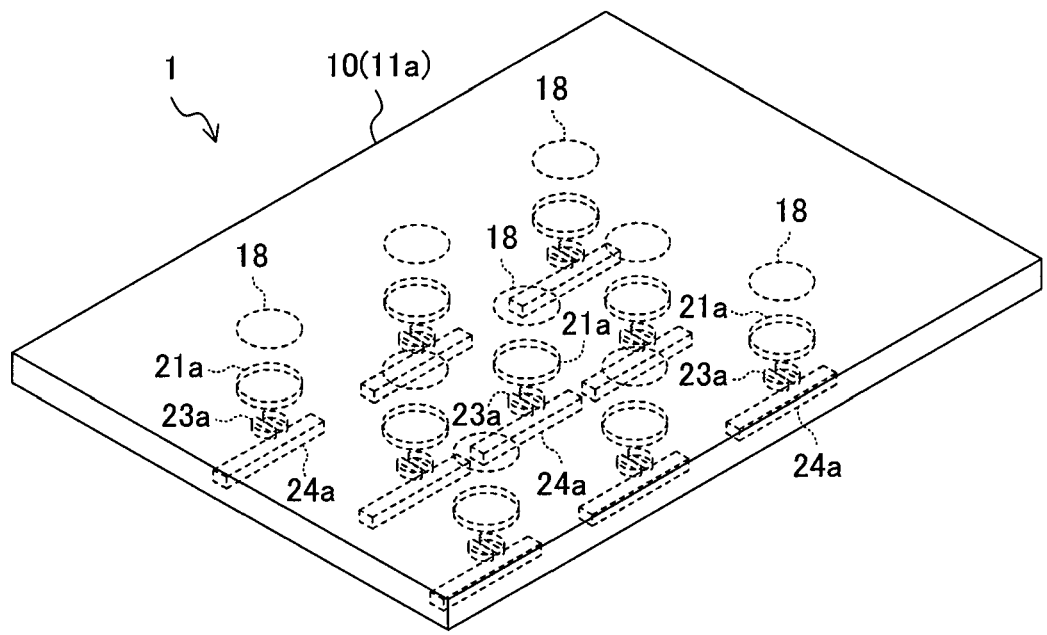
FIG. 6 is a perspective view of an imaging unit according to a variation.

According to this embodiment, three light passing portions 18, 18, 18 are formed in the substrate 11*a*, and three sets of the condenser lens 21*a*, the separator lens 23*a*, and the line sensor 24*a* are provided so as to correspond to the three light passing portions 18, 18, 18. However, the configuration including those components is not limited thereto. The number of sets of those components is not limited to three, but may be any number. For example, as shown in FIG. 6, nine light passing portions 18, 18, . . . may be formed in the substrate 11*a*, and accordingly, nine sets of the condenser lens 21*a*, the separator lens 23*a*, and the line sensor 24*a* may be provided.

Figure 7:
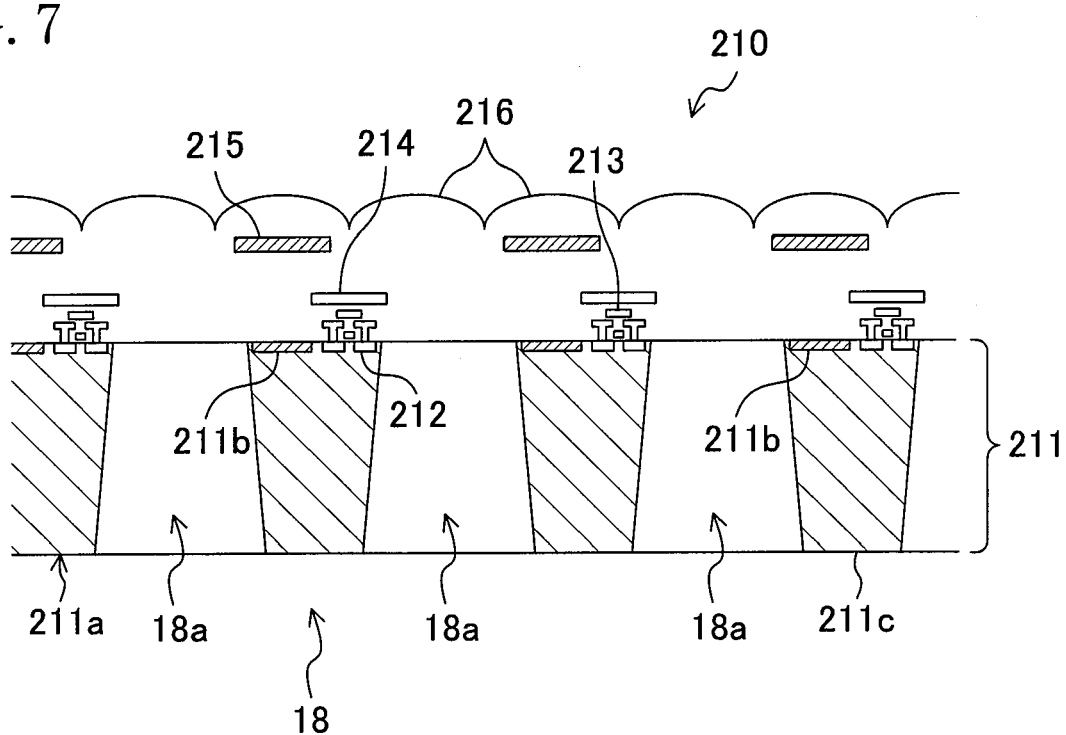
FIG. 7 is a cross-sectional view of an imaging device of the variation.

Further, the imaging device 10 is not limited to a CCD image sensor, but may be, as shown in FIG. 7, a CMOS image sensor.

An imaging device 210 is a CMOS image sensor, and includes a photoelectric conversion section 211 made of a semiconductor material, transistors 212, signal lines 213, masks 214, color filters 215, and microlenses 216.

The photoelectric conversion section 211 includes a substrate 211*a*, and light receiving sections 211*b*, 211*b*, . . . each made of a photodiode. The transistors 212 are respectively provided for the light receiving sections 211*b*. Electrical charge accumulated in the light receiving sections 211*b* is amplified by the transistors 212, and is output to the outside via the signal lines 213. The configurations of the masks 214, the color filters 215, and the microlenses 216 are the same as those of the masks 14, the color filters 15, and the microlenses 16.

As in the CCD image sensor, the light passing portions 18, 18, . . . for allowing irradiation light to pass therethrough are formed in the substrate 211*a*. The light passing portions 18 are made of a plurality of through holes 18*a*, 18*a*, . . . .

In the CMOS image sensor, the amplification factor of the transistor 212 can be determined for each light receiving section 211*b*. Therefore, by determining the amplification factor of each transistor 212 based on the type of color of the color filter 15 associated with each light receiving section 11*b*, the configuration can be simplified.

Furthermore, the phase difference detection unit 20 is not limited to the above-described configuration. For example, a configuration in which a condenser lens is not provided may be employed. Furthermore, as another option, a configuration in which each condenser lens and a corresponding separator lens are formed as a single unit may be employed.

Figure 8:
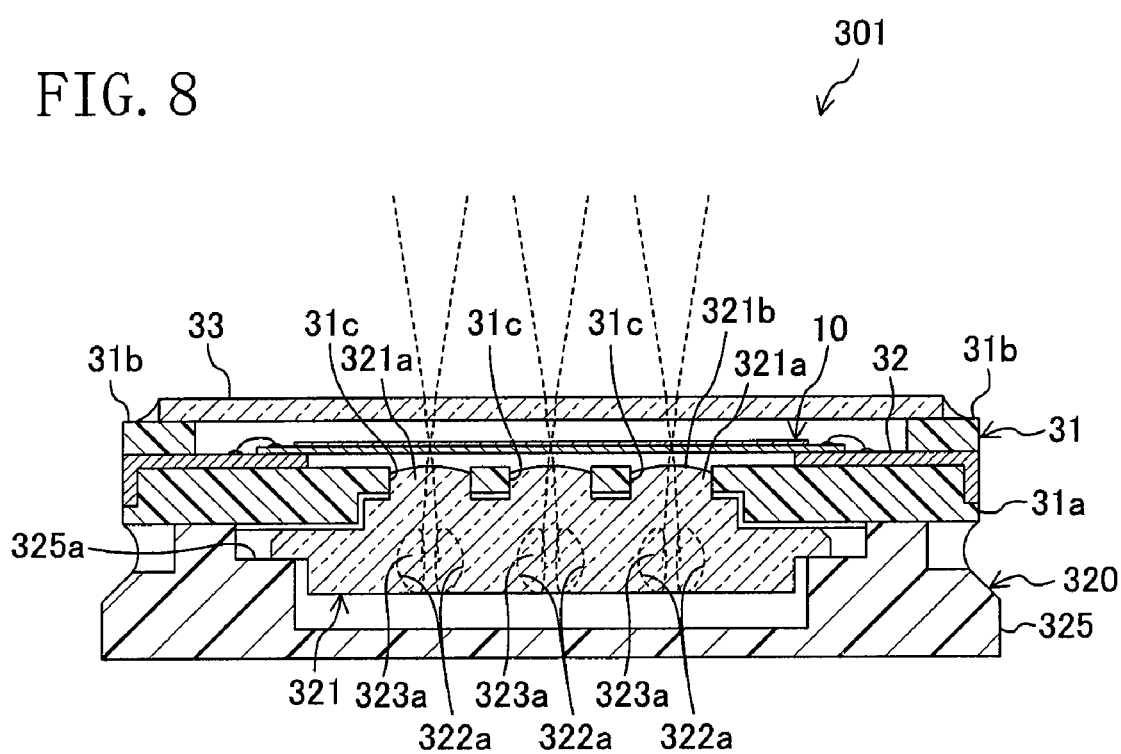
FIG. 8 is a cross-sectional view illustrating a cross section of an imaging unit according to another variation, corresponding to FIG. 2.
Figure 9:
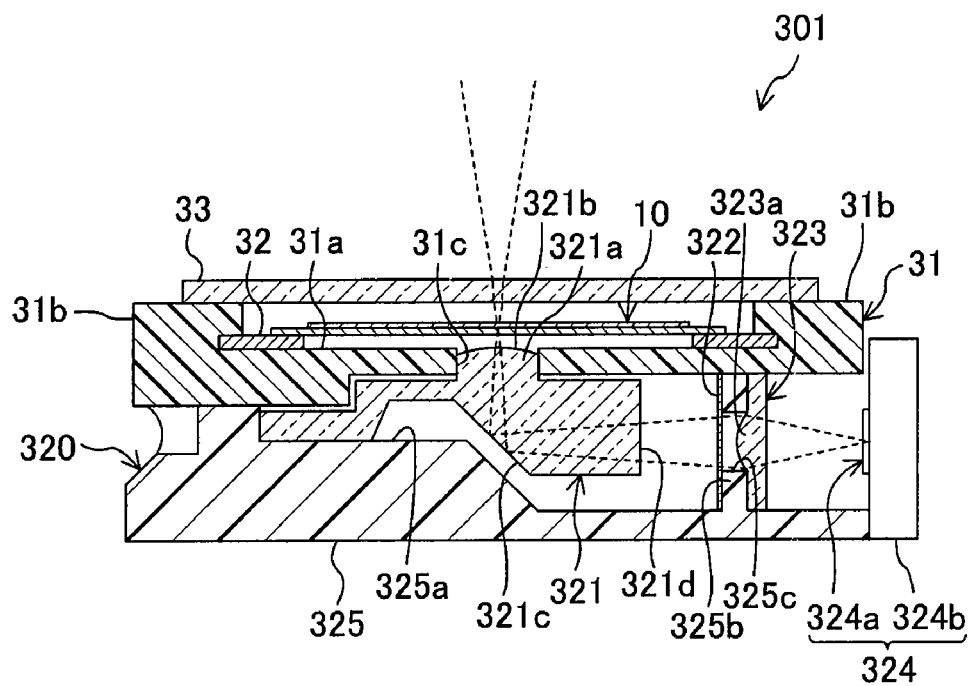
FIG. 9 is a cross-sectional view illustrating a cross section of the imaging unit of the another variation, which is perpendicular to the cross section thereof corresponding to FIG. 2.

As another example, as shown in FIGS. 8 and 9, a phase difference detection unit 320 in which a condenser lens unit 321, a mask member 322, a separator lens unit 323, and a line sensor unit 324 are arranged in the parallel direction to the imaging plane of the imaging device 10 in the back side of the imaging device 10 may be employed.

Specifically, the condenser lens unit 321 is configured such that a plurality of condenser lenses 321*a*, 321*a*, . . . are integrated into a single unit, and includes an incident surface 321*b*, a reflection surface 321*c*, and an output surface 321*d*. That is, in the condenser lens unit 321, light collected by the condenser lenses 321*a*, 321*a*, . . . is reflected on the reflection surface 321*c* at an angle of about 90 degrees, and is output from the output surface 321*d*. As a result, a light path of light which has been transmitted through the imaging device 10 and has entered the condenser lens unit 321 is bent substantially perpendicularly by the reflection surface 321*c*, and is output from the output surface 321*d* to be directed to a separator lens 323*a* of the separator lens unit 323. The light which has entered the separator lens 323*a* is transmitted through the separator lens 323*a*, and an image is formed on a line sensor 324*a*.

The condenser lens unit 321, the mask member 322, the separator lens unit 323, and the line sensor unit 324 configured in the above-described manner are provided within a module frame 325.

The module frame 325 is formed to have a box shape, and a step potion 325*a* for attaching the condenser lens unit 321 is provided in the module frame 325. The condenser lens unit 321 is attached to the step potion 325*a* so that the condenser lenses 321*a*, 321*a*, . . . face outward from the module frame 325.

Moreover, in the module frame 325, an attachment wall potion 325*b* for attaching the mask member 322 and the separator lens unit 323 is provided so as to upwardly extend at a part facing the output surface 321*d* of the condenser lens unit 321. An opening 325*c* is formed in the attachment wall potion 325*b*.

The mask member 322 is attached to a side of the attachment wall potion 325*b* located closer to the condenser lens unit 321. The separator lens unit 323 is attached to an opposite side of the attachment wall potion 325*b* to the side closer to the condenser lens unit 321.

Thus, the light path of light which has passed through the imaging device 10 is bent in the back side of the imaging device 10, and thus, the condenser lens unit 321, the mask member 322, the separator lens unit 323, the line sensor unit 324, and the like can be arranged in the parallel direction to the imaging plane of the imaging device 10, instead of in the thickness direction of the imaging device 10. Therefore, a dimension of the imaging unit 301 in the thickness direction of the imaging device 10 can be reduced. That is, an imaging unit 301 can be formed as a compact size imaging unit 301.

As described above, as long as light which has passed through the imaging device 10 can be received in the back side of the imaging device 10 and then phase difference detection can be performed thereon, a phase difference unit having any configuration may be employed.

Second Embodiment

A camera 100 as an imaging apparatus according to a second embodiment of the present invention will be described.

Figure 10:
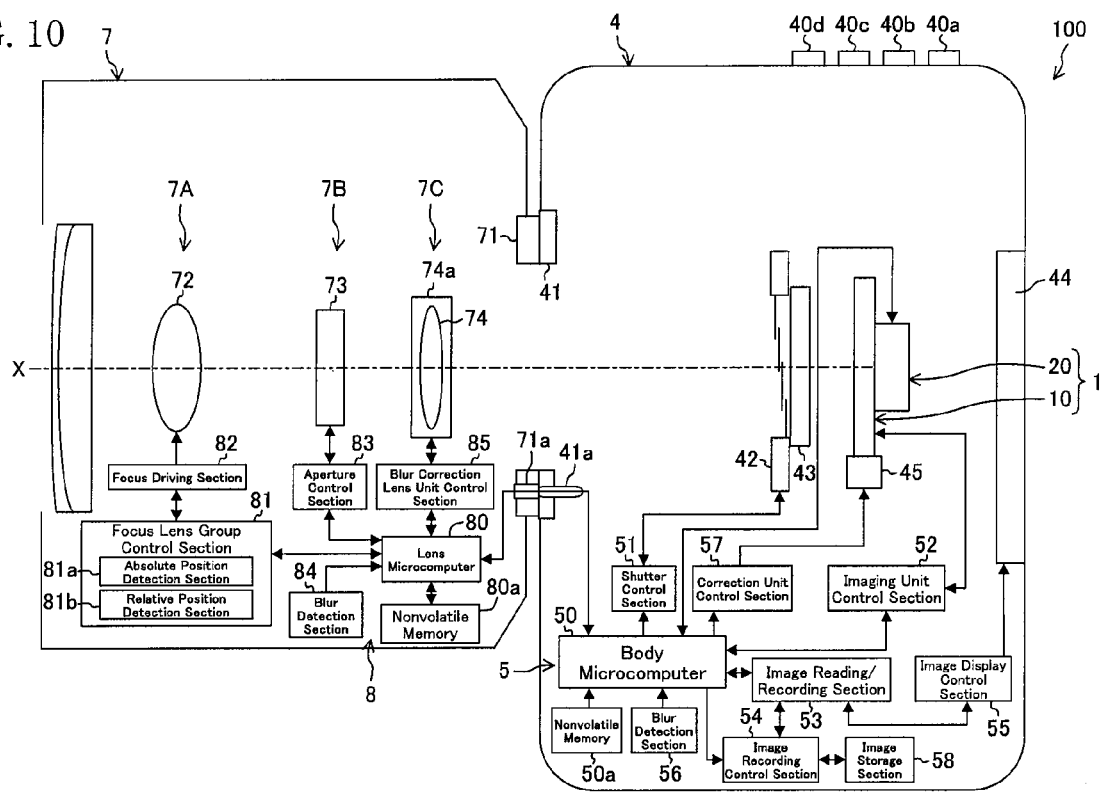
FIG. 10 is a block diagram of a camera according to a second embodiment of the present invention.

As shown in FIG. 10, the camera 100 is a single-lens reflex digital camera with interchangeable lenses, and includes, as major components, a camera body 4 having a major function as a camera system, and interchangeable lenses 7 removably attached to the camera body 4. The interchangeable lenses 7 are attached to a body mount 41 provided on a front face of the camera body 4. The body mount 41 is provided with an electric contact piece 41a.

-Configuration of Camera Body-

The camera body 4 includes: an imaging unit 1 according to the first embodiment for capturing an object image as a shooting image; a shutter unit 42 for adjusting an exposure state of the imaging unit 1, an optical low pass filter (OLPF) 43, also serving as an IR cutter, for removing infrared light of the object image entering the imaging unit 1 and reducing the moire phenomenon; an image display section 44 made of a liquid crystal monitor and configured to display the shooting image, a live view image, and various information; and a body control section 5.

The camera body 4 includes: a power switch 40a for turning the camera system on/off; a release button 40b which is operated by a user when the user performs focusing and releasing operations; and setting switches 40c and 40d for turning various shooting modes and functions on/off.

When the camera system is turned on by the power switch 40a, power is supplied to each part of the camera body 4 and the interchangeable lens 7.

The release button 40b operates as a two-stage switch. Specifically, autofocusing, AE, or the like, which will be described later, is performed by pressing the release button 40b halfway down, and releasing is performed by pressing the release button 40b all the way down.

An AF setting switch 40c is a switch for switching an autofocus function among three states, which will be described later. The camera body 4 is configured such that the autofocus function used in one of the three states by switching the AF setting switch 40c.

A continuous-shooting setting switch 40d is a switch for setting/canceling a continuous shooting mode, which will be described later. The camera body 4 is configured such that a picture shooting mode can be switched between a normal shooting mode and a continuous shooting mode by operating the continuous-shooting setting switch 40d.

The setting switches 40c and 40d may be used for switching other selection items in a menu for selecting a desired camera shooting function.

The imaging unit 1 is configured to be movable by a blur correction unit 45 in a plane perpendicular to an optical axis X.

The body control section 5 includes: a body microcomputer 50; a nonvolatile memory 50a; a shutter control section 51 for controlling driving of the shutter unit 42; an imaging unit control section 52 for controlling operation of the imaging unit 1 and performing A/D conversion on an electrical signal from the imaging unit 1 to output the converted signal to the body microcomputer 50; an image reading/recording section 53 for reading image data from an image storage section 58 such as a card type recording medium or an internal memory and recording image data in the image storage section 58; an image recording control section 54 for controlling the image reading/recording section 53; an image display control section 55 for controlling display of the image display section 44; a blur detection section 56 for detecting the amount of an image blur generated due to a shake of the camera body 4; and a correction unit control section 57 for controlling the blur correction unit 45. The body control section 5 constitutes a control section which generates an image signal based on an output of an imaging device 10.

The body microcomputer 50 is a control device for controlling of core functions of the camera body 4, and performs control of various sequences. The body microcomputer 50 includes, for example, a CPU, a ROM, and a RAM. Programs stored in the ROM are read by the CPU, and thereby, the body microcomputer 50 executes various functions.

The body microcomputer 50 is configured to receive input signals from the power switch 40a, the release button 40b, and each of the setting switches 40c and 40d, and output control signals to the shutter control section 51, the imaging unit control section 52, the image reading/recording section 53, the image recording control section 54, the correction unit control section 57, and the like, thereby causing the shutter control section 51, the imaging unit control section 52, the image reading/recording section 53, the image recording control section 54, the correction unit control section 57, and the like to execute control operations. The body microcomputer 50 performs inter-microcomputer communication with a lens microcomputer 80, which will be described later.

For example, according to an instruction of the body microcomputer 50, the imaging unit control section 52 performs A/D conversion on an electrical signal from the imaging unit 1 to output the converted signal to the body microcomputer 50. The body microcomputer 50 performs predetermined image processing on the received electrical signal to generate an image signal. Then, the body microcomputer 50 transmits the image signal to the image reading/recording section 53, and also instructs the image recording control section 54 to record and display an image, and thereby, the image signal is stored in the image storage section 58 and is transmitted to the image display control section 55. The image display control section 55 controls the image display section 44, based on the transmitted image signal to cause the image display section 44 to display an image.

As the predetermined image processing, the body microcomputer 50 performs, for example, interpolation of an output from a pixel associated with the through holes 18a.

In the nonvolatile memory 50a, various information (unit information) on the camera body 4 is stored. The unit information includes, for example, model information (i.e., unit specific information) provided to specify the camera body 4, such as a name of a manufacturer, a production date, and a model number of the camera body 4, version information on software installed in the body microcomputer 50, and firmware update information, information regarding whether or not the camera body 4 includes sections for correcting an image blur in, for example, the blur correction unit 45 and the blur detection section 56, information regarding detection performance of the blur detection section 56, such as a model number, detection ability, and the like, error history, and the like. Such information as listed above may be stored in a memory section of the body microcomputer 50, instead of the nonvolatile memory 50a.

The blur detection section 56 includes an angular velocity sensor for detecting movement of the camera body 4 due to hand shake and the like. The angular velocity sensor outputs a positive/negative angular velocity signal according to the direction in which the camera body 4 moves, using, as a reference, an output in a state where the camera body 4 stands still. In this embodiment, two angular velocity sensors are provided to detect two directions, i.e., a yawing direction and a pitching direction. After being subjected to filtering, amplification, and the like, the output angular velocity signal is converted into a digital signal by the A/D conversion section, and then, is given to the body microcomputer 50.

-Configuration of Interchangeable Lens-

The interchangeable lens 7 forms an imaging optical system for forming an object image on the imaging unit 1 in the camera body 4, and includes, as major components, a focus adjustment section 7A for performing focusing an aperture adjustment section 7B for adjusting an aperture, a lens image blur correction section 7C for adjusting an optical path to correct an image blur, and a lens control section 8 for controlling operation of the interchangeable lens 7.

The interchangeable lens 7 is attached to the body mount 41 of the camera body 4 via a lens mount 71. The lens mount 71 is provided with an electric contact piece 71a which is electrically connected to the electric contact piece 41a of the body mount 41 when the interchangeable lens 7 is attached to the camera body 4.

The focus adjustment section 7A includes a focus lens group 72 for adjusting a focus. The focus lens group 72 is movable in the optical axis X direction in a zone from a closest focus position predetermined as a standard for the interchangeable lens 7 to an infinite focus position. When a focus position is detected using a contrast detection method which will be described later, the focus lens group 72 has to be movable forward and backward from a focus position in the optical axis X direction. Therefore, the focus lens group 72 has a lens shift margin zone which allows the focus lens group 72 to move forward and backward in the optical axis X direction to a further distance beyond the zone ranging from the closest focus position to the infinite focus position.

The aperture adjustment section 7B includes an aperture section 73 for adjusting an aperture.

The lens image blur correction section 7C includes a blur correction lens 74, and a blur correction lens driving section 74a for shifting the blur correction lens 74 in a plane perpendicular to the optical axis X.

The lens control section 8 includes a lens microcomputer 80, a nonvolatile memory 80a, a focus lens group control section 81 for controlling operation of the focus lens group 72, a focus driving section 82 for receiving a control signal from the focus lens group control section 81 to drive the focus lens group 72, an aperture control section 83 for controlling operation of the aperture section 73, a blur detection section 84 for detecting a blur of the interchangeable lens 7, and a blur correction lens unit control section 85 for controlling the blur correction lens driving section 74a.

The lens microcomputer 80 is a control device for controlling core functions of the interchangeable lens 7, and is connected to each component mounted on the interchangeable lens 7. Specifically, the lens microcomputer 80 includes a CPU, a ROM, and a RAM and, when programs stored in the ROM are read by the CPU, various functions can be executed. For example, the lens microcomputer 80 has the function of setting a lens image blur correction system (e.g., the blur correction lens driving section 74a) to be a correction possible state or a correction impossible state, based on a signal from the body microcomputer 50. Due to the contact between the electric contact piece 71a provided to the lens mount 71 with the electric contact piece 41a provided to the body mount 41, the body microcomputer 50 is electrically connected to the lens microcomputer 80, so that information can be transmitted/received between the body microcomputer 50 and the lens microcomputer 80.

In the nonvolatile memory 80a, various information (e.g., lens information) for the interchangeable lens 7 is stored. The lens information includes, for example, model information (i.e., lens specific information) provided to specify the interchangeable lens 7, such as a name of a manufacturer, a production date, and a model number of the interchangeable lens 7, version information for software installed in the lens microcomputer 80, and firmware update information, and information regarding whether or not the interchangeable lens 7 includes sections for correcting an image blur in, for example, the blur correction lens driving section 74a and the blur detection section 84. If the interchangeable lens 7 includes sections for correcting an image blur, the lens information further includes information regarding detection performance of the blur detection section 84 such as a model number, detection ability, and the like, information regarding correction performance (i.e., lens side correction performance information) of the blur correction lens driving section 74a such as a model number, a maximum correctable angle, and the like, version information for software for performing image blur correction, and the like. Furthermore, the lens information includes information (i.e., lens side power consumption information) regarding power consumption necessary for driving the blur correction lens driving section 74a, and information (i.e., lens side driving method information) regarding a method for driving the blur correction lens driving section 74a. The nonvolatile memory 80a can store information transmitted from the body microcomputer 50. The information listed above may be stored in a memory section of the lens microcomputer 80, instead of the nonvolatile memory 80a.

The focus lens group control section 81 includes an absolute position detection section 81a for detecting an absolute position of the focus lens group 72 in the optical axis direction, and a relative position detection section 81b for detecting a relative position of the focus lens group 72 in the optical axis direction. The absolute position detection section 81a detects an absolute position of the focus lens group 72 in a case of the interchangeable lens 7. For example, the absolute position detection section 81a includes a several-bit contact-type encoder substrate and a brush, and is capable of detecting an absolute position. The relative position detection section 81b cannot detect the absolute position of the focus lens group 72 by itself, but can detect a moving direction of the focus lens group 72 using, for example, a two-phase encoder. As for the two-phase encoder, two rotary pulse encoders, two MR devices, two hall devices, or the like, for alternately outputting binary signals with an equal pitch according to the position of the focus lens group 72 in the optical axis direction are provided so that the phases of their respective pitches are different from each other. The lens microcomputer 80 calculates the relative position of the focus lens group 72 in the optical axis direction from an output of the relative position detection section 81b.

The blur detection section 84 includes an angular velocity sensor for detecting movement of the interchangeable lens 7 due to hand shake and the like. The angular velocity sensor outputs a positive/negative angular velocity signal according to the direction in which the interchangeable lens 7 moves, using, as a reference, an output in a state where the interchangeable lens 7 stands still. In this embodiment, two angular velocity sensors are provided to detect two directions, i.e., a yawing direction and a pitching direction. After being subjected to filtering, amplification, and the like, the output angular velocity signal is converted into a digital signal by the A/D conversion section, and then, is given to the lens microcomputer 80.

The blur correction lens unit control section 85 includes a movement amount detection section (not shown). The movement amount detection section is a detection section for detecting an actual movement amount of the blur correction lens 74. The blur correction lens unit control section 85 performs feedback control of the blur correction lens 74 based on an output from the movement amount detection section.

An example in which the blur detection sections 56 and 84 and the blur correction units 45 and 74*a* are provided to both of the camera body 4 and the interchangeable lens 7 has been described. However, such blur detection section and blur correction unit may be provided to either one of the camera body 4 and the interchangeable lens 7. Alternatively, a configuration where such blur detection section and blur correction unit are not provided to any of the camera body 4 and the interchangeable lens 7 may be employed (in such a configuration, a sequence regarding the above-described blur correction may be eliminated).

-Operation of Camera-

The camera 100 configured in the above-described manner has various image shooting modes and functions. Various image shooting modes and functions of the camera 100 and the operation thereof at the time of each of the modes and functions will be described hereinafter.

-AF Function-

When the release button 40*b* is pressed halfway down, the camera 100 performs AF to focus. To perform AF, the camera 100 has three autofocus functions, i.e., phase difference detection AF, contrast detection AF, and hybrid AR A user can select one of the three autofocus functions by operating the AF setting switch 40*c* provided to the camera body 4.

Assuming that the camera system is in a normal shooting mode, the shooting operation of the camera system using each of the autofocus functions will be described hereinafter. The "normal shooting mode" herein means a most basic shooting mode of the camera 100 for shooting a normal picture.

(Phase Difference Detection AF)

Figure 11:
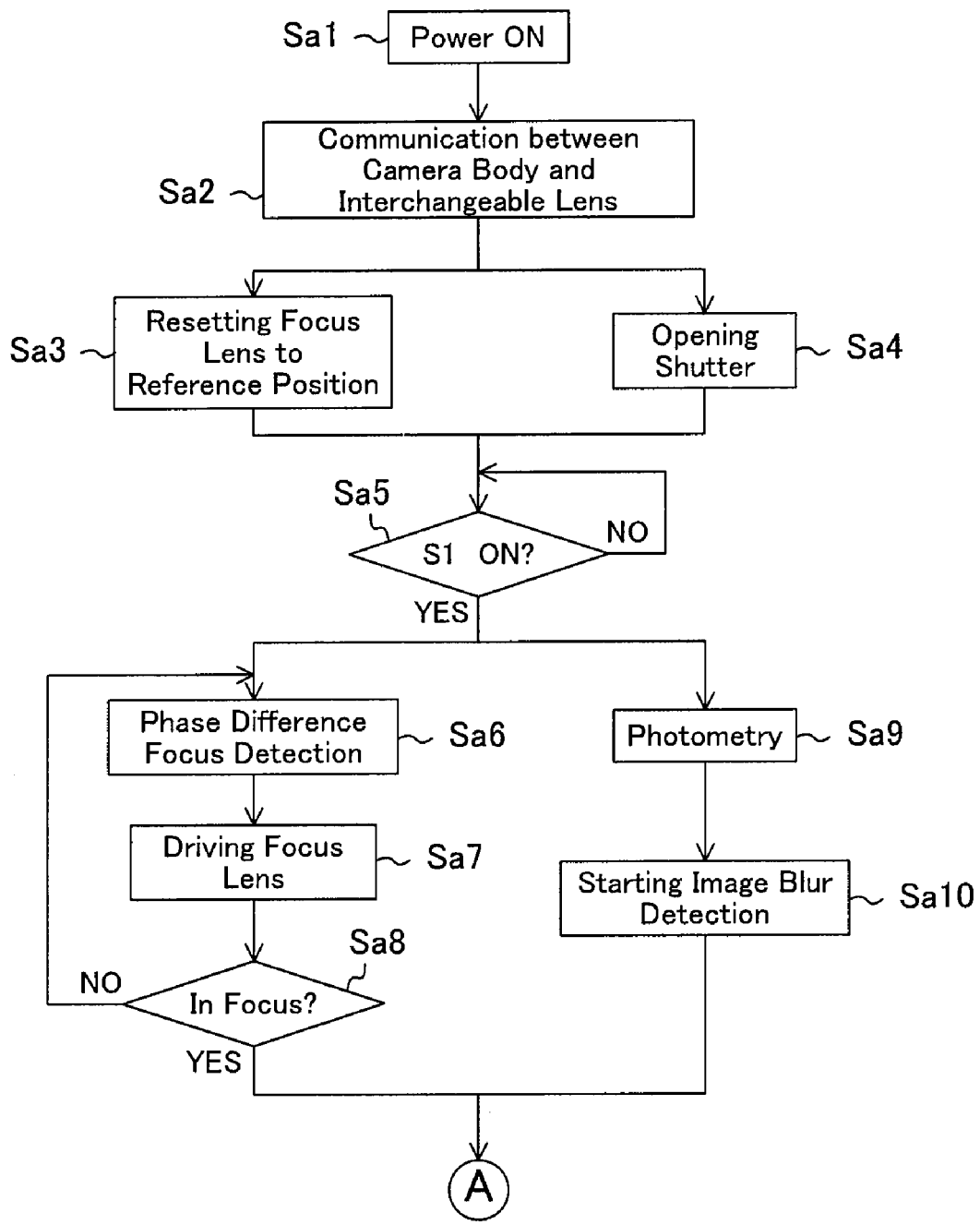
FIG. 11 is a flowchart showing a flow in shooting operation by phase difference detection AF before a release button is pressed all the way down.
Figure 12:
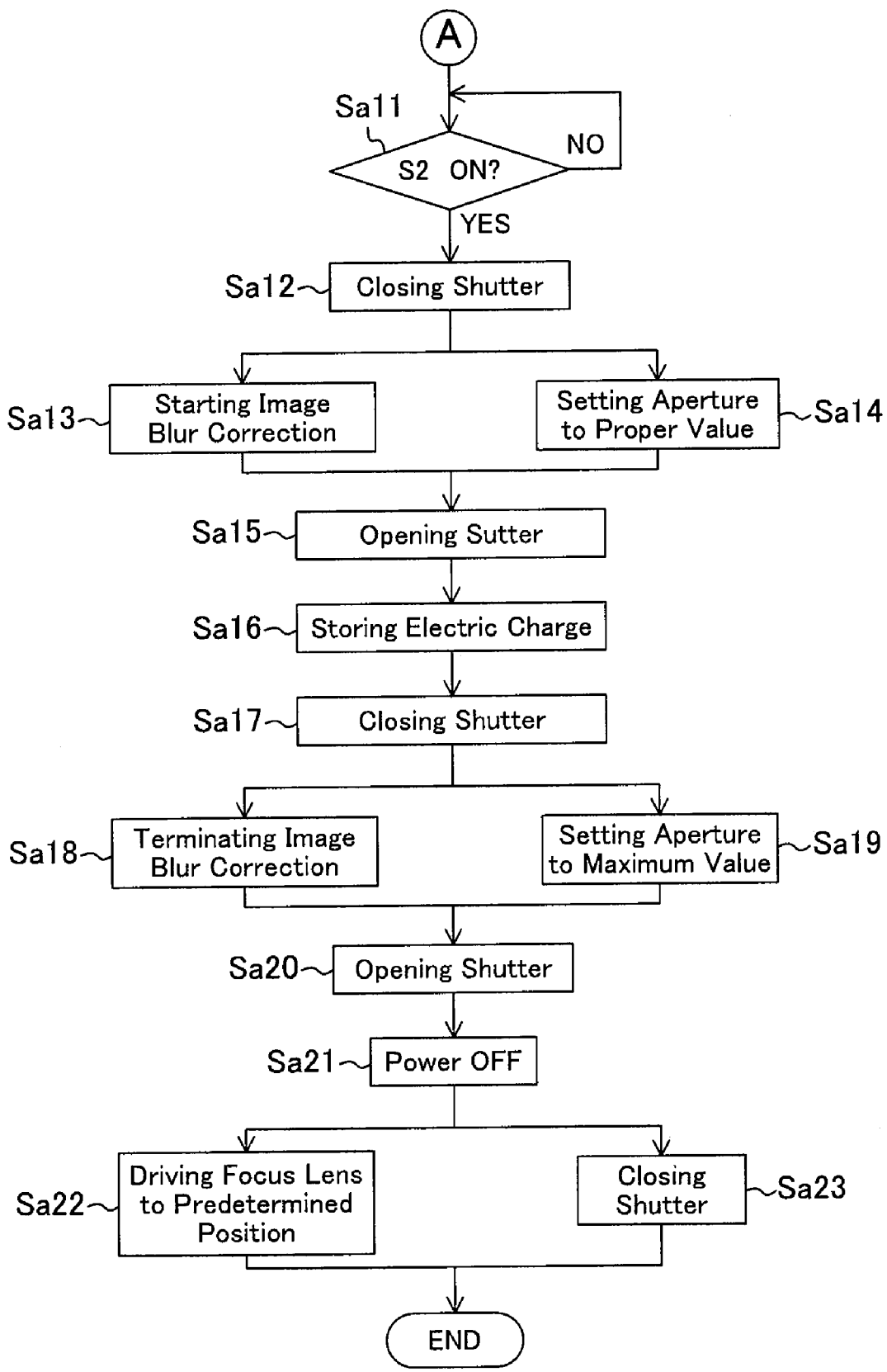
FIG. 12 is a flowchart showing a basic flow in shooting operation including shooting operation by phase difference detection AF after the release button is pressed all the way down.

First, the shooting operation of the camera system using phase difference detection AF will be described with reference of FIGS. 11 and 12.

When the power switch 40*a* is turned on (Step Sa1), communication between the camera body 4 and the interchangeable lens 7 is performed (Step Sa2). Specifically, power is supplied to the body microcomputer 50 and each of other units in the camera body 4 to start up the body microcomputer 50. At the same time, power is supplied to the lens microcomputer 80 and each of other units in the interchangeable lens 7 via the electric contact pieces 41*a* and 71*a* to start up the lens microcomputer 80. The body microcomputer 50 and the lens microcomputer 80 are programmed to transmit/receive information to/from each other at start-up time. For example, lens information on the interchangeable lens 7 is transmitted from the memory section of the lens microcomputer 80 to the body microcomputer 50, and then is stored in the memory section of the body microcomputer 50.

Subsequently, the body microcomputer 50 performs positioning the focus lens group 72 at a predetermined reference position which has been determined in advance by the lens microcomputer 80 (Step Sa3), and in parallel to Step Sa3, changes the shutter unit 42 to an open state (Step Sa4). Then, the process proceeds to Step Say, and the body microcomputer 50 remains in a standby state until the release button 40*b* is pressed halfway down by the user.

Thus, light which has been transmitted through the interchangeable lens 7 and has entered the camera body 4 passes through the shutter unit 42, is transmitted through the OLPF 43 also serving as an IR cutter, and then enters the imaging unit 1. An object image formed at the imaging unit 1 is displayed on the image display section 44, so that the user can see an erect image of an object via the image display section 44. Specifically, the body microcomputer 50 reads an electrical signal from the imaging device 10 via the imaging unit control section 52 at constant intervals, and performs predetermined image processing on the read electrical signal. Then, the body microcomputer 50 generates an image signal, and controls the image display control section 55 to cause the image display section 44 to display a live view image.

Part of the light which has entered the imaging unit 1 passes through the light passing portions 18, 18, . . . of the imaging device 10, and enters the phase difference detection unit 20.

In this case, when the release button 40*b* is pressed halfway down (i.e., an S1 switch, which is not shown in the drawings, is turned on) by the user (Step Sa5), the body microcomputer 50 amplifies an output from the line sensor 24*a* of the phase difference detection unit 20, and then performs operation by the arithmetic circuit, thereby determining whether or not an object image is in focus, whether the object is in front focus or back focus, and the Df amount (Step Sa6).

Thereafter, the body microcomputer 50 drives the focus lens group 72 via the lens microcomputer 80 in the defocus direction by the Df amount obtained in Step Sa6 (Step Sa7).

In this case, the phase difference detection unit 2 of this embodiment includes three sets of the condenser lens 21*a*, the mask openings 22*a*, 22*a*, the separator lens 23*a*, and the line sensor 24*a*, i.e., has three distance measurement points at which phase difference detection is performed. In phase difference detection in phase difference detection AF or hybrid AF, the focus lens group 72 is driven based on an output of the line sensor 24*a* of one of the sets corresponding to a distance measurement point arbitrarily selected by the user.

Alternatively, an automatic optimization algorithm may be installed in the body microcomputer 50 beforehand in order to select one of the distance measurement points located closest to the camera and drive the focus lens group 72. Thus, the rate of the occurrence of focusing on the background of an object instead of the object can be reduced.

This selection of the distance measurement point is not limited to phase difference detection AF. As long as the focus lens group 72 is driven using the phase difference detection unit 2, AF using any method can be employed.

Then, it is determined whether or not an object image is in focus (Step Sa8). Specifically, if the Df amount obtained based on the output of the line sensor 24*a* is smaller than or equal to a predetermined value, it is determined that an object image is in focus (i.e., YES), and then, the process proceeds to Step Sa11. If the Df amount obtained based on the output of the line sensor 24*a* is larger than the predetermined value, it is determined that an object image is not in focus (i.e., NO), the process returns to Step Sa6, and Steps Sa6-Sa8 are repeated.

As described above, detection of a focus state and driving of the focus lens group 72 are repeated and, when the Df amount becomes smaller than or equal to the predetermined value, it is determined that an object image is in focus, and driving of the focus lens group 72 is halted.

In parallel to phase difference detection AF in Steps Sa6-Sa8, photometry is performed (Step Sa9), and image blur detection is also started (Step Sa10).

Specifically, in Step Sa9, the amount of light entering the imaging device 10 is measured by the imaging device 10. That is, in this embodiment, the above-described phase difference detection AF is performed using light which has entered the imaging device 10 and has passed through the imaging device 10, and thus, photometry can be performed using the imaging device 10 in parallel to the above-described phase difference detection AF.

More specifically, the body microcomputer 50 loads an electrical signal from the imaging device 10 via the imaging unit control section 52, and measures the brightness of an object light, based on the electrical signal, thereby performing photometry. According to a predetermined algorithm, the body microcomputer 50 determines, from a result of photometry, shutter speed and an aperture value which correspond to a shooting mode at a time of the exposure.

When photometry is terminated in Step Sa9, image blur detection is started in Step Sa10. Step Sa9 and Step Sa10 may be performed in parallel.

When the release button 40*b* is pressed halfway down by the user, various information on shooting, as well as a shooting image, is displayed on the image display section 44, and thus, the user can confirm each type of information via the image display section 44.

In Step Sa11, the body microcomputer 50 remains in a standby state until the release button 40*b* is pressed all the way down (i.e., an S2 switch, which is not shown in the drawings, is turned on) by the user. When the release button 40*b* is pressed all the way down by the user, the body microcomputer 50 once puts the shutter unit 42 into a closed state (Step Sa12). Then, while the shutter unit 42 is kept in a closed state, electrical charge stored in the light receiving sections 11*b*, 11*b*, . . . of the imaging device 10 are transferred for the exposure, which will be described later.

Thereafter, the body microcomputer 50 starts correction of an image blur, based on communication information between the camera body 4 and the interchangeable lens 7 or any information specified by the user (Step Sa13). Specifically, the blur correction lens driving section 74*a* in the interchangeable lens 7 is driven based on information of the blur detection section 56 in the camera body 4. According to the intention of the user, any one of (i) use of the blur detection section 84 and the blur correction lens driving section 74*a* in the interchangeable lens 7, (ii) use of the blur detection section 56 and the blur correction unit 45 in the camera body 4, and (iii) use of the blur detection section 84 in the interchangeable lens 7 and the blur correction unit 45 in the camera body 4 can be selected.

By starting driving of the image blur correction sections at a time when the release button 40*b* is pressed halfway down, the movement of an object desired to be in focus is reduced, and thus, phase difference detection AF can be performed with higher accuracy.

The body microcomputer 50 stops down, in parallel to starting of image blur correction, the aperture section 73 by the lens microcomputer 80 so as to attain an aperture value calculated based on a result of photometry in Step Sa9 (Step Sa14).

Thus, when the image blur correction is started and the aperture operation is terminated, the body microcomputer 50 puts the shutter unit 42 into an open state, based on the shutter speed obtained from the result of photometry in Step Sa9 (Step Sa15). In the above-described manner, the shutter unit 42 is put into an open state, so that light from the object enters the imaging device 10, and electrical charge is stored in the imaging device 10 only for a predetermined time (Step Sa16).

The body microcomputer 50 puts the shutter unit 42 into a closed state, based on the shutter speed, to terminate the exposure (Step Sa17). After the termination of the exposure, in the body microcomputer 50, image data is read out from the imaging unit 1 via the imaging unit control section 52 and then, after performing predetermined image processing on the image data, the image data is output to the image display control section 55 via the image reading/recording section 53. Thus, a shooting image is displayed on the image display section 44. The body microcomputer 50 stores the image data in the image storage section 58 via the image recording control section 54, as necessary.

Thereafter, the body microcomputer 50 terminates image blur correction (Step Sa18), and releases the aperture section 73 (Step Sa19). Then, the body microcomputer 50 puts the shutter unit 42 into an open state (Step Sa20).

When a reset operation is terminated, the lens microcomputer 80 notifies the body microcomputer 50 of the termination of the reset operation. The body microcomputer 50 waits for receiving reset termination information from the lens microcomputer 80 and the termination of a series of processings after the exposure. Thereafter, the body microcomputer 50 confirms that the release button 40*b* is not in a pressed state, and terminates a shooting sequence. Then, the process returns to Step Say, and the body microcomputer 50 remains in a standby state until the release button 40*b* is pressed halfway down.

When the power switch 40*a* is turned off (Step Sa21), the body microcomputer 50 shifts the focus lens group 72 to a predetermined reference position (Step Sa22), and puts the shutter unit 42 into a closed state (Step Sa23). Then, operation of the body microcomputer 50 and other units in the camera body 4, and the lens microcomputer 80 and other units in the interchangeable lens 7 is halted.

As described above, in shooting operation of the camera system using phase difference detection AF, photometry is performed by the imaging device 10 in parallel to autofocusing based on the phase difference detection unit 20. Specifically, the phase difference detection unit 20 receives light which has passed through the imaging device 10 to obtain defocus information, and thus, whenever the phase difference detection unit 20 obtains defocus information, the imaging device 10 is irradiated with light from an object. Therefore, photometry is performed using light which has passed through the imaging device 10 in autofocusing. By doing the above-described operation, a photometry sensor does not have to be additionally provided, and photometry can be performed before the release button 40*b* is pressed all the way down, so that a time (hereinafter also referred to as a "release time lag") from a time point when the release button 40*b* is pressed all the way down to a time point when the exposure is terminated can be reduced.

Moreover, even in a configuration in which photometry is performed before the release button 40*b* is pressed all the way down, by performing photometry in parallel to autofocusing, increase in processing time after the release button 40*b* is pressed halfway down can be prevented. In such a case, a mirror for guiding light from an object to a photometry sensor or a phase difference detection unit does not have to be provided.

Conventionally, part of light from an object to an imaging apparatus is guided to a phase difference detection unit provided outside the imaging apparatus by a mirror or the like. In contrast, according to this embodiment, a focus state can be detected by the phase difference detection unit 20 using light guided to the imaging unit 1 as it is, and thus, the focus state can be detected with very high accuracy.

(Contrast Detection AF)

Figure 13:
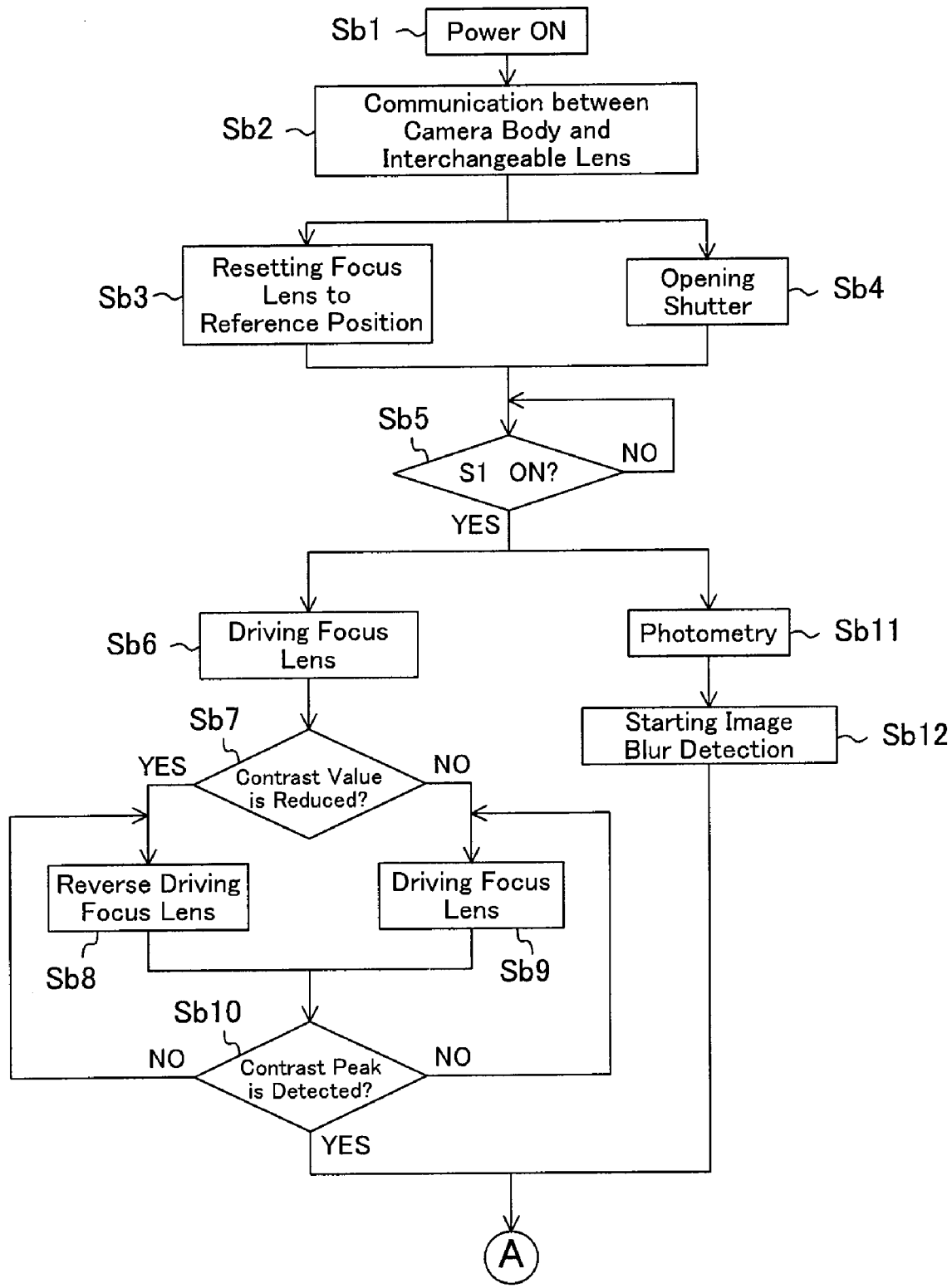
FIG. 13 is a flowchart showing a flow in shooting operation by contrast detection AF before the release button is pressed all the way down.

Next, the shooting operation of the camera system using contrast detection AF will be described with reference to FIG. 13.

When the power switch 40*a* is turned on (Step Sb1), communication between the camera body 4 and the interchangeable lens 7 is performed (Step Sb2), the focus lens group 72 is positioned at a predetermined reference position (Step Sb3), the shutter unit 42 is put into an open state (Step Sb4) in parallel to Step Sb3, and then, the body microcomputer 50 remains in a standby state until the release button 40b is pressed halfway down (Step Sb5). The above-described steps, i.e., Steps Sb1-Sb5, are the same as Steps Sa1-Sa5 in phase difference detection AF.

When the release button 40b is pressed halfway down by the user (Step Sb5), the body microcomputer 50 drives the focus lens group 72 via the lens microcomputer 80 (Step Sb6). Specifically, the body microcomputer 50 drives the focus lens group 72 so that a focal point of an object image is moved in a predetermined direction (e.g., toward an object) along the optical axis.

Then, the body microcomputer 50 obtains a contrast value for the object image, based on an output from the imaging device 10 received by the body microcomputer 50 via the imaging unit control section 52 to determine whether or not the contrast value is reduced (Step Sb7). If the contrast value is reduced (i.e., YES), the process proceeds to Step Sb8. If the contrast value is increased (i.e., NO), the process proceeds to Step Sb9.

Reduction in contrast value means that the focus lens group 72 is driven in an opposite direction to the direction in which the object image is brought in focus. Therefore, when the contrast value is reduced, the focus lens group 72 is reversely driven so that the focal point of the object image is moved in an opposite direction to the predetermined direction (e.g., toward the opposite side to the object) along the optical axis (Step Sb8). Thereafter, it is determined whether or not a contrast peak is detected (Step Sb10). During a period in which the contrast peak is not detected (i.e., NO), reverse driving of the focus lens group 72 (Step Sb8) is repeated. When a contrast peak is detected (i.e., YES), reverse driving of the focus lens group 72 is halted, and the focus lens group 72 is moved to a position where the contrast value has reached the peak. Then, the process proceeds to Step Sa11.

On the other hand, when the focus lens group 72 is driven in Step Sb6 and the contrast value is increased, the focus lens group 72 is driven in the direction in which the object image is brought in focus. Therefore, driving of the focus lens group 72 is continued (Step Sb9), and it is determined whether or not a peak of the contrast value is detected (Step Sb10). Consequently, during a period in which the contrast peak is not detected (i.e., NO), driving of the focus lens group 72 (Step Sb9) is repeated. When a contrast peak is detected (i.e., YES), driving of the focus lens group 72 is halted, and the focus lens group 72 is moved to a position where the contrast value has reached the peak. Then, the process proceeds to Step Sa11.

As has been described, in the contrast detection method, the focus lens group 72 is driven tentatively (Step Sb6). Then, if the contrast value is reduced, the focus lens group 72 is reversely driven to search for the peak of the contrast value (Steps Sb8 and Sb10). If the contrast value is increased, driving of the focus lens group 72 is continued to search for the peak of the contrast value (Steps Sb9 and Sb10).

In parallel to this contrast detection AF (i.e., Steps Sb6-Sb10), photometry is performed (Step Sb11) and image blur detection is started (Step Sb12). Steps Sb11 and Sb12 are the same as Steps Sa9 and Sa1t) in phase difference detection AF.

In Step Sa11, the body microcomputer 50 remains in a standby state until the release button 40b is pressed all the way down by the user. A flow of steps after the release button 40b is pressed all the way down is the same as that of phase difference detection AF.

In this contrast detection AF, a contrast peak can be directly obtained, and thus, unlike phase difference detection AF, various correction operations such as release back correction (for correcting an out-of-focus state related to the degree of aperture) and the like are not necessary, so that highly accurate focusing performance can be achieved. However, to detect the peak of a contrast value, the focus lens group 72 has to be driven until the focus lens group 72 is moved so as to exceed the peak of the contrast value once. Accordingly, the focus lens group 72 has to be once moved to a position where the focus lens group 72 exceeds the peak of the contrast value and then be moved back to a position corresponding to the detected peak of the contrast value, and thus, a backlash generated in a focus lens group driving system due to the operation of driving the focus lens group 72 in back and forth directions has to be removed.

(Hybrid AF)

Figure 14:
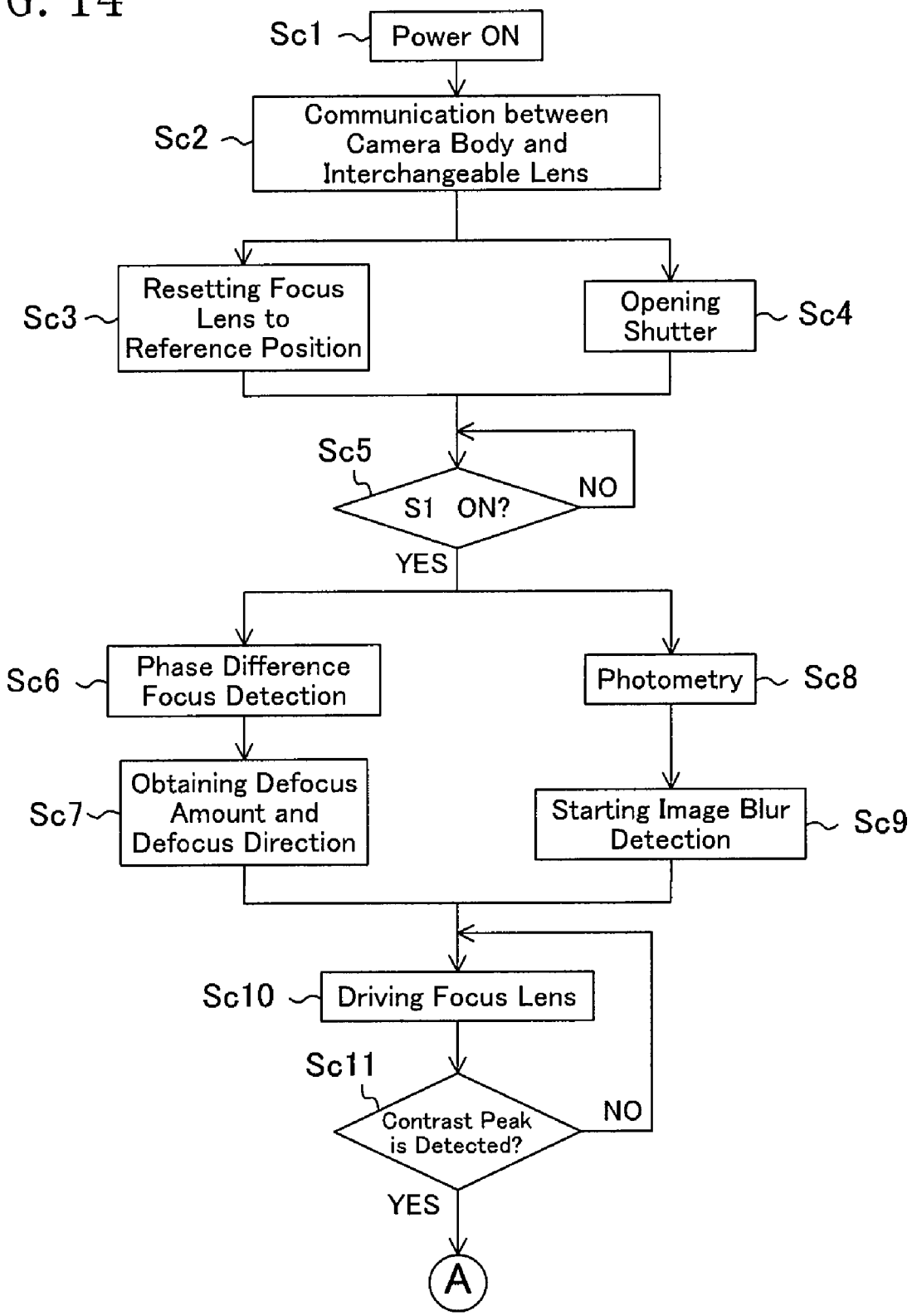
FIG. 14 is a flowchart showing a flow in shooting operation by hybrid AF before the release button is pressed all the way down.

Subsequently, the shooting operation of the camera system using hybrid AF will be described with reference to FIG. 14.

Steps (i.e., Steps Sc1-Sc5) from the step in which the power switch 40a is turned on to the step in which the release button 40b is pressed halfway down are the same as Steps Sa1-Sa5 in phase difference detection AF.

When the release button 40b is pressed halfway down by the user (Step Sc5), the body microcomputer 50 amplifies an output from the line sensor 24a of the phase difference detection unit 20, and then performs operation by the arithmetic circuit, thereby determining whether or not an object image is in focus (Step Sc6). Furthermore, the body microcomputer 50 determines where an object image is formed, i.e., whether the object is in front focus or back focus, and the Df amount, and then, obtains defocus information (Step Sc7). Thereafter, the process proceeds to Step Sc10.

In parallel to Steps Sc6 and Sc7, photometry is performed (Step Sc8) and image blur detection is started (Step Sc9). Steps Sc6 and Sc7 are the same as Steps Sa9 and Sa10 in phase difference detection AF. Thereafter, the process proceeds to Step Sc10. Note that, after Step Sc9, the process may also proceed to Step Sa11, instead of Sc10.

As decried above, in this embodiment, using light which has entered the imaging device 10 and has passed through the imaging device 10, the above-described focus detection based on a phase difference is performed. Thus, in parallel to the above-describe focus detection, photometry can be performed using the imaging device 10.

In Step Sc10, the body microcomputer 50 drives the focus lens group 72, based on the defocus information obtained in Step Sc7.

The body microcomputer 50 determines whether or not a contrast peak is detected (Step Sc11). During a period in which the contrast peak is not detected (i.e., NO), driving of the focus lens group 72 (Step Sc10) is repeated. When a contrast peak is detected (i.e., YES), driving of the focus lens group 72 is halted, and the focus lens group 72 is moved to a position where the contrast value has reached the peak. Then, the process proceeds to Step Sa11.

Specifically, in Steps Sc10 and Sc11, it is preferable that, based on the defocus direction and the defocus amount calculated in Step Sc7, after the focus lens group 72 is moved at high speed, the focus lens group 72 is moved at lower speed and a contrast peak is detected.

In this case, it is preferable that an moving amount of the focus lens group 72 which is moved based on the calculated defocus amount (i.e., a position to which the focus lens group 72 is moved) is set to be different from that in Step Sa7 in phase difference detection AF. Specifically, in Step Sa7 in phase difference detection AF, the focus lens group 72 is moved to a position which is estimated as a focus position, based, on the defocus amount. In contrast, in Step Sc10 in hybrid AF, the focus lens group 72 is driven to a position shifted forward or backward from the position estimated as a focus position, based on the defocus amount. Thereafter, in hybrid AF, a contrast peak is detected while the focus lens group 72 is driven toward the position estimated as the focus position.

In Step Sa11, the body microcomputer 50 remains in a standby state until the release button 40*b* is pressed all the way down by the user. A flow of steps after the release button 40*b* is pressed all the way down is the same as that of phase difference detection AF.

As has been described, in hybrid AF, first, defocus information is obtained by the phase difference detection unit 20, and the focus lens group 72 is driven based on the defocus information. Then, a position of the focus lens group 72 at which a contrast value calculated based on an output from the imaging device 10 reaches a peak is detected, and the focus lens group 72 is moved to the position. Thus, defocus information can be detected before driving the focus lens group 72, and therefore, unlike contrast detection AF, the step of tentatively driving the focus lens group 72 is not necessary. This allows reduction in processing time for autofocusing. Moreover, an object image is brought in focus by contrast detection AF eventually, and therefore, particularly, an object having a repetitive pattern, an object having extremely low contrast, and the like can be brought in focus with higher accuracy than in phase difference detection AF.

Since defocus information is obtained by the phase difference detection unit 20 using light which has passed through the imaging device 10, photometry can be performed by the imaging device 10 in parallel to the step of obtaining defocus information by the phase difference detection unit 20 although hybrid AF includes phase difference detection. As a result, a mirror for dividing part of light from an object to detect a phase difference does not have to be provided, and a photometry sensor does not have to be additionally provided. Furthermore, photometry can be performed before the release button 40*b* is pressed all the way down. Therefore, a release time lag can be reduced. In the configuration in which photometry is performed before the release button 40*b* is pressed all the way down, photometry can be performed in parallel to the step of obtaining defocus information, thereby preventing increase in processing time after the release button 40*b* is pressed halfway down.

-Variations-

In the foregoing description, aperture operation is performed after the release button 40*b* is pressed all the way down and immediately before exposure. On the other hand, the following description is directed to a variation in which aperture operation is performed before the release button 40*b* is pressed all the way down and before autofocus in phase difference detection AF and hybrid AF.

(Phase Difference Detection AF)

Figure 15:
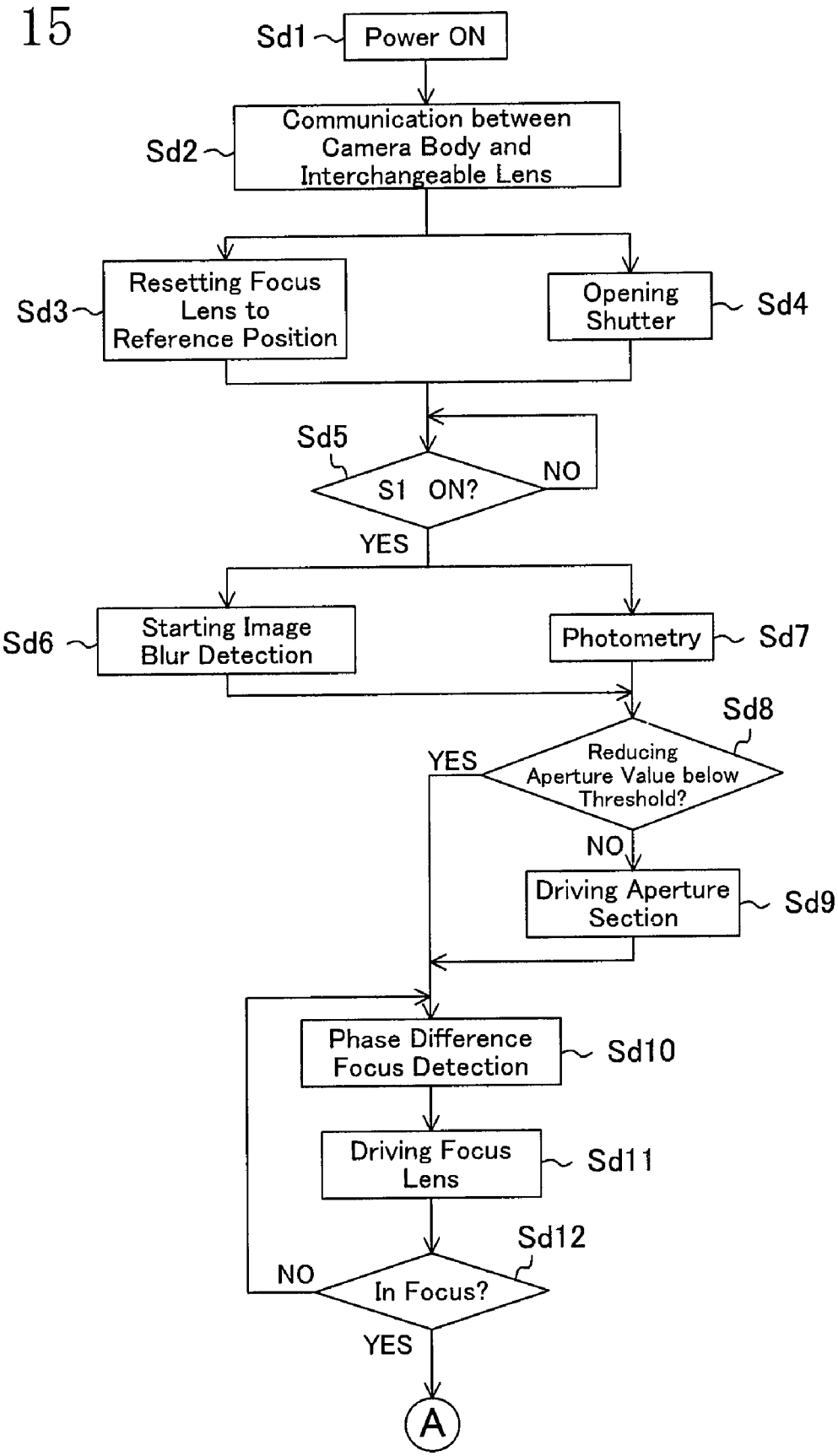
FIG. 15 is a flowchart showing a flow in shooting operation by phase difference detection AF of a variation before the release button is pressed all the way down.

Specifically, first, shooting operation of the camera system using phase difference detection AF according to the variation will be described with reference of FIG. 15.

Steps (i.e., Steps Sd1-Sd5) from the step in which the power switch 40*a* is turned on to the step in which the body microcomputer 50 remains in a standby state until the release button 40*b* is pressed halfway down are the same as Steps Sa1-Sa5 in phase difference detection AF described above.

When the release button 40*b* is pressed halfway down by the user (Step Sd5), image blur detection is started (Step Sd6). In parallel to Step Sd6, photometry is performed (Step Sd7). Steps Sd5 and Sd6 are the same as Steps Sa9 and Sa10 in phase difference detection AF.

Thereafter, based on a result of the photometry performed in Step Sd7, an aperture value during exposure is obtained, and it is determined whether or not the obtained aperture value is larger than a predetermined aperture threshold (Step Sd8). If the obtained aperture value is larger than the predetermined aperture threshold (i.e., YES), the process proceeds to Step Sd10. If the obtained aperture value is smaller than or equal to the predetermined aperture threshold (i.e., NO), the process proceeds to Step Sd9. In Step Sd9, the body microcomputer 50 drives the aperture section 73 via the lens microcomputer 80 so as to attain the obtained aperture value.

Here, the predetermined aperture threshold is set at an aperture value at which defocus information can be obtained based on an output of the line sensor 24*a* of the phase difference detection unit 20. Specifically, in a case where the aperture value obtained based on the result of photometry is larger than the aperture threshold, if the aperture section 73 is stopped down to the aperture value, obtaining defocus information by the phase difference detection unit 20, which will be describe later, cannot be performed. Therefore, in this case, the aperture section 73 is not stopped down and the process proceeds to Step Sd10. On the other hand, if the aperture value obtained based on the result of photometry is smaller than or equal to the aperture threshold, the aperture section 73 is stopped down to the aperture value and the process proceeds to Step Sd10.

In Steps Sd10-Sd12, as in Steps Sa6-Sa8 in phase difference detection AF described above, the body microcomputer 50 obtains defocus information based on an output from the line sensor 24*a* of the phase difference detection unit 20 (Step Sd10). Based on the defocus information, the focus lens group 72 is driven (Step Sd11), and then it is determined whether or not an object image is in focus (Step Sd12). After the object image has been in focus, the process proceeds to Step Sa11.

In Step Sa11, the body microcomputer 50 remains in a standby state until the release button 40*b* is pressed all the way down by the user. A flow of steps after the release button 40*b* has been pressed all the way down is the same as in phase difference detection AF described above.

It should be noted that aperture operation of the aperture section 73 is performed in Step Sa14 only when the aperture value obtained based on the result of photometry in Step Sd8 is larger than the predetermined aperture threshold. Specifically, aperture operation of the aperture section 73 has been performed in Step Sd9 if it is determined that the aperture value obtained based on the result of photometry in Step Sd8 is smaller than or equal to the predetermined aperture threshold. Thus, it is unnecessary to perform Step Sa14.

In this manner, in shooting operation of the camera system using phase difference detection AF according to this variation, if the aperture value during exposure obtained based on the result of photometry is at such a value that allows phase difference detection AF to be performed, the aperture section 73 is stopped down before autofocus prior to the exposure. Thus, aperture operation of the aperture section 73 does not have to be performed after the release button 40*b* has been pressed all the way down, thereby reducing a release time lag.

(Hybrid AF)

Figure 16:
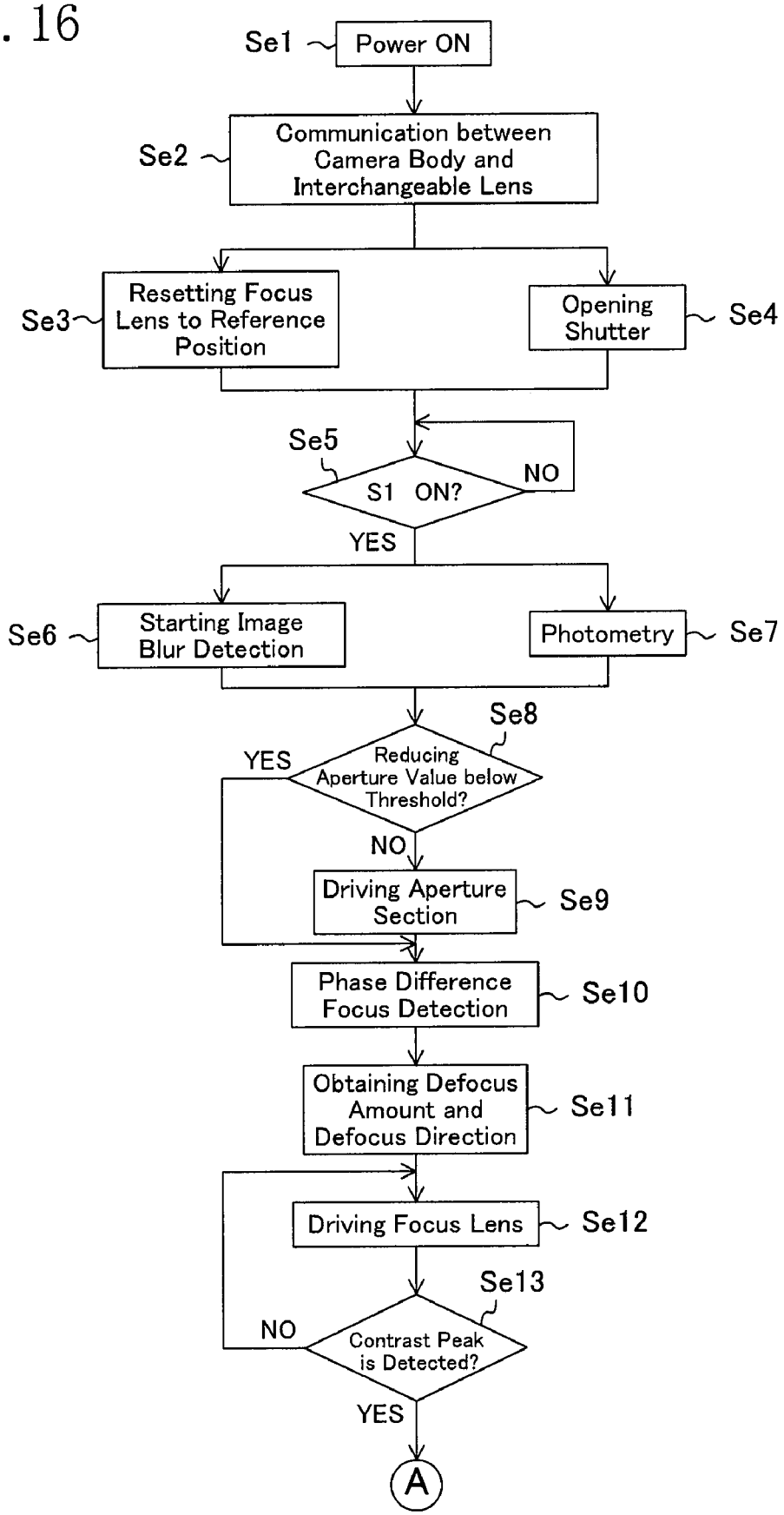
FIG. 16 is a flowchart showing a flow in shooting operation by hybrid AF of the variation before the release button is pressed all the way down.

Next, shooting operation of the camera system using hybrid AF according to the variation will be described with reference of FIG. 16.

Steps (i.e., Steps Se1-Se5) from the step in which the power switch 40*a* is turned on to the step M which the body microcomputer 50 remains in a standby state until the release button 40*b* is pressed halfway down are the same as Steps Sa1-Sa5 in phase difference detection AF described above.

When the release button 40*b* is pressed halfway down by the user (Step Se5), image blur detection is started (Step Se6).

In parallel to Step Se6, photometry is performed (Step Se7). Steps Se6 and Se7 are the same as Steps Sa9 and Sa10 in phase difference detection AF.

Thereafter, based on a result of the photometry performed in Step Se7, an aperture value during exposure is obtained, and it is determined whether or not the obtained aperture value is larger than a predetermined aperture threshold (Step Se8). If the obtained aperture value is larger than the predetermined aperture threshold (i.e., YES), the process proceeds to Step Se10. If the obtained aperture value is smaller than or equal to the predetermined aperture threshold (i.e., NO), the process proceeds to Step Se9. In Step Se9, the body microcomputer 50 drives the aperture section 73 via the lens microcomputer 80 so as to attain the obtained aperture value.

Here, the predetermined aperture threshold is set at an aperture value at which a peak of a contrast value calculated from an output from the imaging device 10 can be detected. Specifically, in a case where the aperture value obtained based on the result of photometry is larger than an aperture threshold, if the aperture section 73 is stopped down to the aperture value, detection of the contrast peak, which will be describe later, cannot be performed. Therefore, in this case, the aperture section 73 is not stopped down and the process proceeds to Step Se10. On the other hand, if the aperture value obtained based on the result of photometry is smaller than or equal to the aperture threshold, the aperture section 73 is stopped down to the aperture value and the process proceeds to Step Se10.

In Steps Se10-Se12, as in Steps Sc6, Sc7, Sc10, and Sc11 in normal hybrid AF described above, the body microcomputer 50 obtains defocus information based on an output from the line sensor 24a of the phase difference detection unit 20 (Steps Se10 and Se11). Based on the defocus information, the focus lens group 72 is driven (Step Se12). Then, a contrast peak is detected, and the focus lens group 72 is moved to a position where the contrast value has reached the peak (Step Se13).

Subsequently, in Step Sa11, the body microcomputer 50 remains in a standby state until the release button 40b is pressed all the way down by the user. A flow of steps after the release button 40b has been pressed all the way down is the same as in normal phase difference detection AF described above.

It should be noted that aperture operation of the aperture section 73 is performed in Step Sa14 only when the aperture value obtained based on the result of photometry in Step Se8 is larger than the predetermined aperture threshold. Specifically, aperture operation of the aperture section 73 has been performed in Step Se9 if it is determined that the aperture value obtained based on the result of photometry in Step Se8 is smaller than or equal to the predetermined aperture threshold. Thus, it is unnecessary to perform Step Sa14.

In this manner, in shooting operation of the camera system using hybrid AF according to this variation, if the aperture value during exposure obtained based on the result of photometry is at such a value that allows contrast detection AF to be performed, the aperture section 73 is stopped down before autofocus prior to the exposure. Thus, aperture operation of the aperture section 73 does not have to be performed after the release button 40b has been pressed all the way down, thereby reducing a release time lag.

-Continuous Shooting Mode-

In the foregoing description, one image is captured every time the release button 40b is pressed all the way down. The camera 100 also has a continuous shooting mode in which a plurality of images are captured by pressing the release button 40b all the way down at a time.

Figure 17:
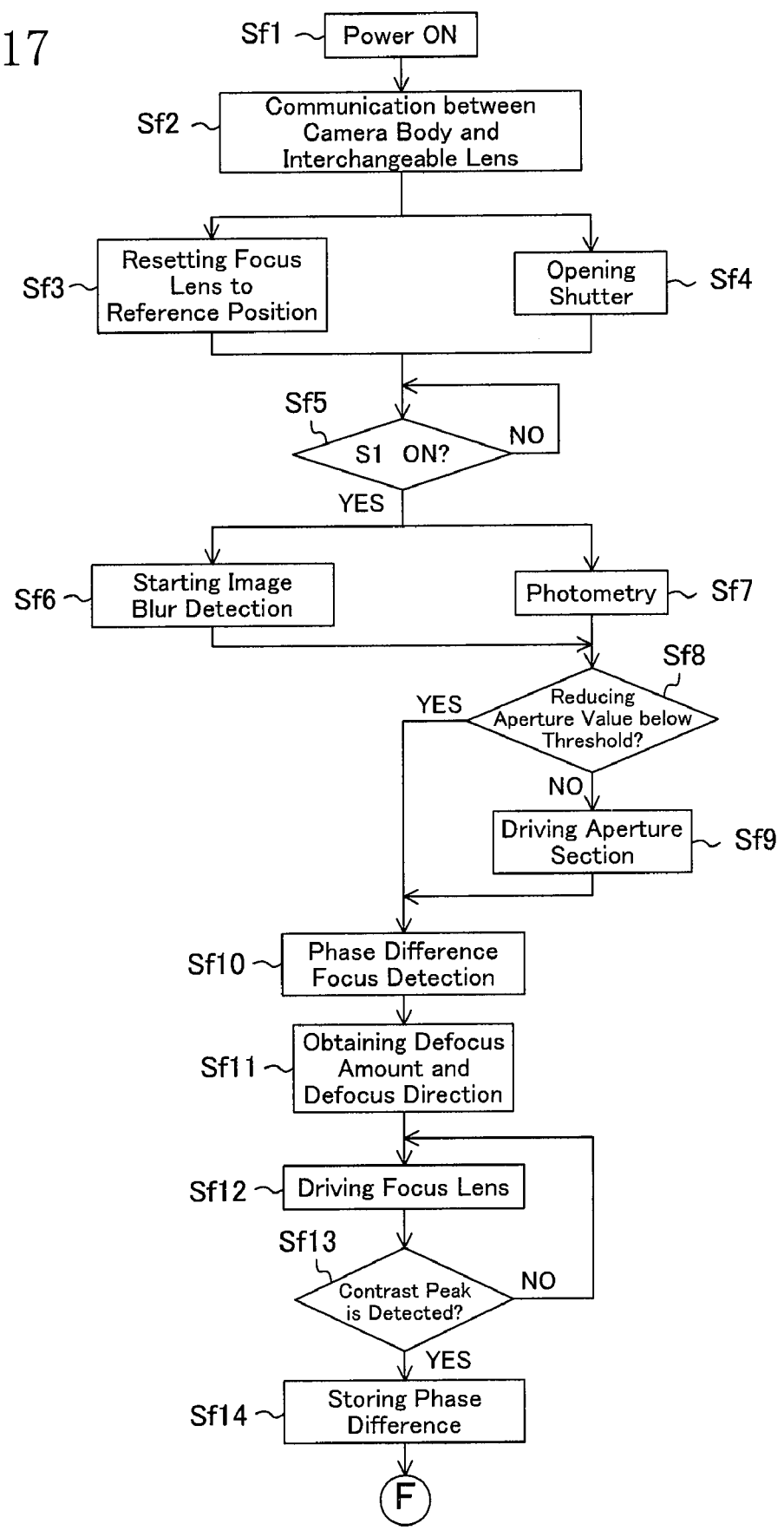
FIG. 17 is a flowchart showing a flow in shooting operation in a continuous shooting mode before the release button is pressed all the way down.
Figure 18:
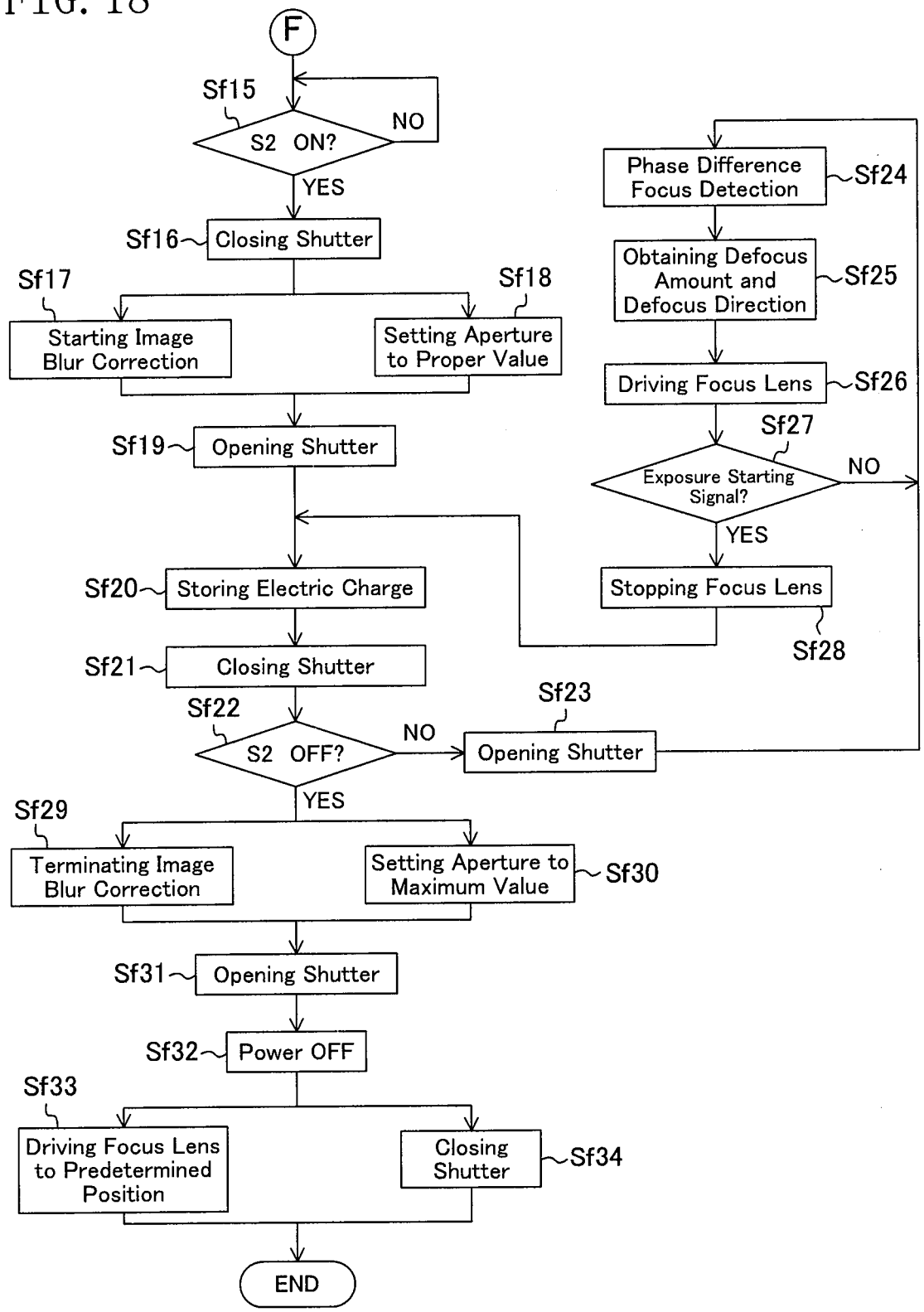
FIG. 18 is a flowchart showing a flow in shooting operation in the continuous shooting mode after the release button is pressed all the way down.

The continuous shooting mode will be described hereinafter with reference to FIGS. 17 and 18. The following description is directed to hybrid AF according to the variation. It should be noted that the continuous shooting mode is not limited to hybrid AF of the variation, and may be applied to any operation such as phase difference detection AF, contrast detection AF, hybrid AF, and phase difference detection AF of the variation.

Steps (i.e., Steps Sf1-Sf13) from the step in which the power switch 40a is turned on to the step in which the release button 40b is pressed halfway down so that the focus lens group 72 is moved to a position where the contrast value reaches a peak are the same as Steps Se1-Se13 in hybrid AF of the variation.

After the focus lens group 72 has been moved to the position where the contrast value reaches a peak, the body microcomputer 50 causes the distance between two object images formed on the line sensor 24a at this time (i.e., when the object images are brought in focus by contrast detection AF) to be stored in the memory section (Step Sf14).

Thereafter, in Step Sf15, the body microcomputer 50 remains in a standby state until the release button 40b is pressed all the way down by the user. When the release button 40b is pressed all the way down by the user, exposure is performed in the same manner as in Steps Sa12-Sa17 in phase difference detection AF.

Specifically, the body microcomputer 50 once puts the shutter unit 42 into a closed state (Step Sf16), and correction of an image blur is started (Step Sf17). If the aperture section 73 is not stopped down in Step Sf9, the aperture section 73 is stopped down based on a result of photometry (Step Sf18), and then the shutter unit 42 is put into an open state (Step Sf19) to start exposure (Step Sf20). Thereafter, in this case, the shutter unit 42 is put into a closed state (Step Sf21) to terminate the exposure.

After the exposure, it is determined whether or not pressing the release button 40b all the way down is canceled (Step Sf22). If the pressing the release button 40b all the way down is canceled (i.e., YES), the process proceeds to Steps Sf29 and Sf30. If the pressing the release button 40b all the way down is continued (i.e., NO), the process proceeds to Step Sf23 to perform continuous shooting.

While the release button 40b is put all the way down, the body microcomputer 50 puts the shutter unit 42 into an open state (Step Sf23), and phase difference detection AF is performed (Steps Sf24-Sf26).

Specifically, a focus state of an object image in the imaging device 10 is detected via the phase difference detection unit 20 (Step Sf24), defocus information is obtained (Step Sf25). Based on the defocus information, the focus lens group 72 is driven (Step Sf26).

Here, in hybrid AF before the release button 40b is pressed all the way down, defocus information is obtained by comparing the distance between two object images formed on the line sensor 24a with a predetermined reference distance (Step Sf11). In contrast, in Steps Sf24 and Sf25 after the release button 40b has been pressed all the way down, a focus state and defocus information are obtained by comparing the distance between two object images formed on the line sensor 24a with the distance of two object images formed on the line sensor 24a stored in Step Sf14 after contrast detection AF in hybrid AF.

After phase difference detection AF has been performed in the above-described manner, the body microcomputer 50 determines whether or not it is time to output a signal (i.e., an exposure start signal) for starting exposure from the body microcomputer 50 to the shutter control section 51 and the imaging unit control section 52 (Step Sf27). This timing of outputting of an exposure start signal is a timing of continuous shooting in the continuous shooting mode. If it is not time to output an exposure start signal (i.e., NO), phase difference detection AF is repeated (Steps Sf24-Sf26). If it is time to output an exposure start signal (i.e., YES), driving of the focus lens group 72 is stopped (Step Sf28), and exposure is performed (Step Sf20).

After the focus lens group 72 has been stopped and before exposure is started, it is necessary to remove electrical charge accumulated in the light receiving sections 11b, 11b, . . . of the imaging device 10 during phase difference detection AF. Accordingly, electrical charge in the light receiving sections 11b, 11b, . . . is removed by an electronic shutter, or the shutter unit 42 is once put into a closed state so as to remove electrical charge in the light receiving sections 11b, 11b, . . . and then is put into an open state, and then exposure is started.

After the exposure, it is determined whether or not pressing the release button 40b all the way down is canceled (Step Sf22). While the release button 40b is pressed all the way down, phase difference detection AF and exposure are repeated (Steps Sf23-Sf28, Sf20, and Sf21).

On the other hand, if the pressing the release button 40b all the way down is canceled, correction of an image blur is terminated (Step Sf29), and in addition, the aperture section 73 is opened (Step Sf30), thereby putting the shutter unit 42 into an open state (Step Sf31).

After completion of the resetting, when a shooting sequence is terminated, the process returns to Step Sa5, and the body microcomputer 50 remains in a standby state until the release button 40b is pressed halfway down.

When the power switch 40a is turned off (Step Sf32), the body microcomputer 50 shifts the focus lens group 72 to a predetermined reference position (Step Sf33), and puts the shutter unit 42 into a closed state (Step Sf34). Then, operation of the body microcomputer 50 and other units in the camera body 4, and the lens microcomputer 80 and other units in the interchangeable lens 7 is halted.

In this manner, in shooting operation of the camera system in the continuous shooting mode, phase difference detection AF can be performed among periods of exposure in continuous shooting, thereby achieving highly accurate focusing performance.

In addition, since autofocus at this time is phase difference detection AF, defocus direction can be instantaneously obtained. Accordingly, even in a short period between continuous shootings, the camera system can focus instantaneously.

Further, even in phase difference detection AF, no movable mirrors for phase difference detection do not have to be provided, unlike conventional techniques. Accordingly, a release time lag can be reduced, and power consumption can be reduced. Moreover, in a conventional technique, a release time lag is caused by moving a movable mirror up and down. Thus, if an object is a moving object, it is necessary to capture an image with predictions made on movement of the moving object in the release time lag. In contrast, in this embodiment, since no release time lag exists for up and down movement of a movable mirror, the camera system can focus, while following movement of an object until immediately before exposure.

Further, in phase difference detection AF during continuous shooting, the distance between two object images on the line sensor 24a which are in focus by contrast detection AF when the release button 40b is pressed halfway down, is used as a reference distance between two object images on the line sensor 24a for determining whether or not an object image is in focus. Thus, highly accurate autofocus suitable for actual apparatus and actual shooting conditions can be performed.

The method employed in shooting a first frame in the continuous shooting mode is not limited to hybrid AF, and may be phase difference detection AF or contrast detection AF. Note that in the case of phase difference detection AF, Step Sf14 is not performed, and in Steps Sf24 and Sf25, a focus state and defocus information are obtained by comparing the distance between two object images formed on the line sensor 24a with the predetermined reference distance.

This description is not limited to the continuous shooting mode. In normal shooting, if an object is a moving object, even after the image has been in focus, phase difference detection AF may be performed until the release button 40b is pressed all the way down.

-Low Contrast Mode-

The camera 100 of this embodiment is configured to switch the type of autofocus according to the contrast of object images. Specifically, the camera 100 includes a low contrast mode in which shooting is performed under low contrast.

Figure 19:
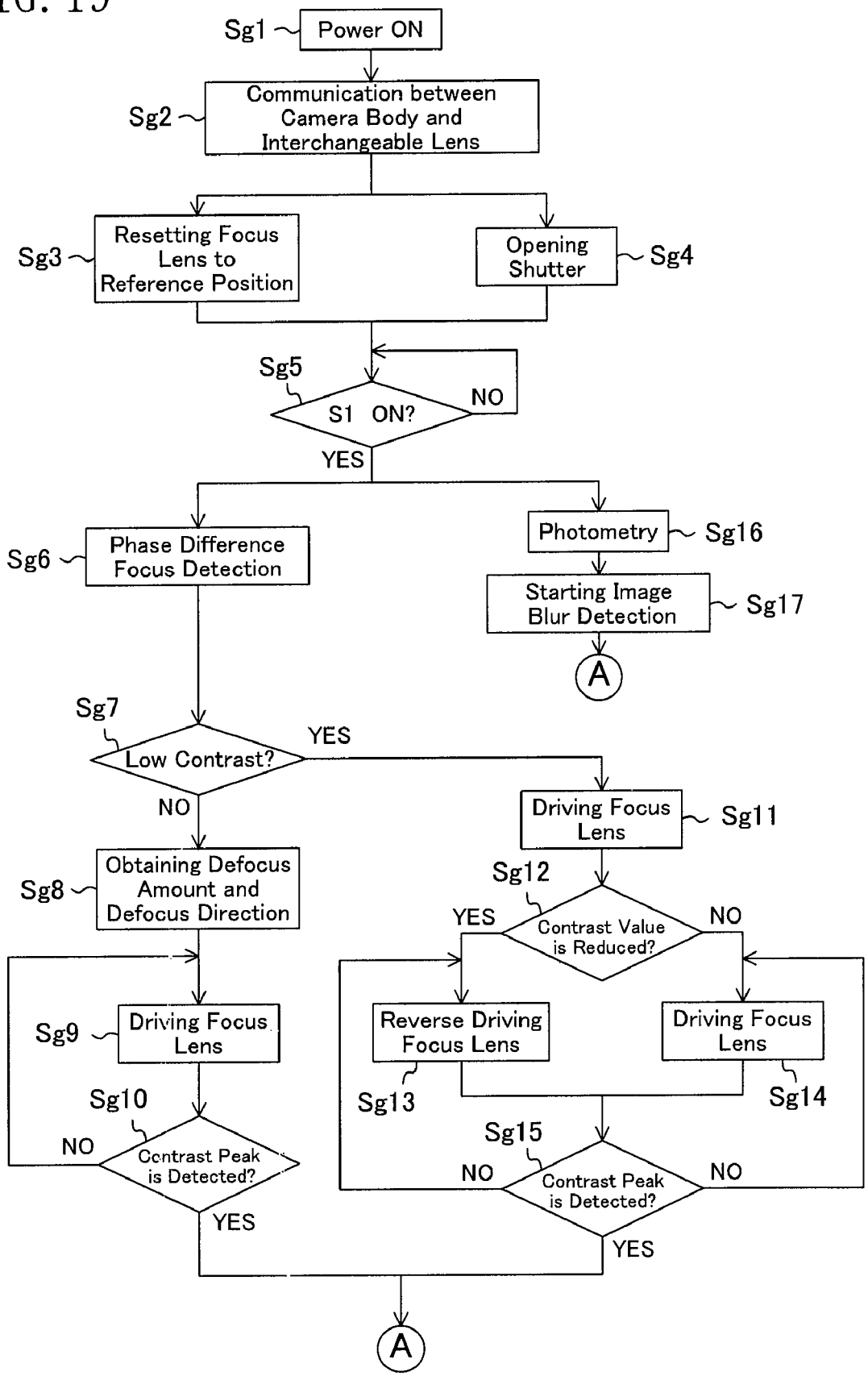
FIG. 19 is a flowchart showing a flow in shooting operation in a low contrast mode before the release button is pressed all the way down.

The low contrast mode will be described hereinafter with reference to FIG. 19. The following description is directed to operation using hybrid AF. The low contrast mode is not limited to hybrid AF, and may be applied to any operation such as phase difference detection AF, contrast detection AF, phase difference detection AF of the variation, and hybrid AF of the variation.

Steps (i.e., Steps Sg1-Sg5) from the step in which the power switch 40a is turned on to the step in which the body microcomputer 50 remains in a standby state until the release button 40b is pressed halfway down are the same as Steps Sa1-Sa5 in phase difference detection AF, When the release button 40b is pressed halfway down by the user (Step Sg5), the body microcomputer 50 amplifies an output from the line sensor 24a of the phase difference detection unit 20, and then performs operation with the arithmetic circuit (Step Sg6). Then, it is determined whether object images are in a low contrast state or not (Step Sg7). Specifically, it is determined whether or not the contrast value is large enough to detect the positions of two object images formed on the line sensor 24a based on an output from the line sensor 24a.

Consequently, if the contrast value is large enough to detect the positions of the two object images (i.e., NO), it is determined that the objects are not in a low contrast state. Then, the process proceeds to Step Sg8, and hybrid AF is performed. Steps Sg8-Sg10 are the same as Steps Sc7, Sc10, and Sc11 in hybrid AF.

On the other hand, if the contrast value is not large enough to detect the positions of two object images (i.e., YES), it is determined that the objects are in a low contrast state. Then, the process proceeds to Step Sg11, and contrast detection AF is performed. Steps Sg11-Sg15 are the same as Steps Sb6-Sb10 in contrast detection AF. After hybrid AF or contrast detection AF has been performed in the above-described manner, the process proceeds to Step Sa11.

In parallel to the autofocus operation (i.e., Steps Sg6-Sg15), photometry is performed (Step Sg16), and image blur detection is started (Step Sg17). Steps Sg16 and Sg17 are the same as Steps Sa9 and Sa10) in phase difference detection AF. Thereafter, the process proceeds to Step Sa11.

In Step Sa11, the body microcomputer 50 remains in a standby state until the release button 40b is pressed all the way down by the user. A flow of steps after the release button 40b has been pressed all the way down is the same as in normal hybrid AF.

Specifically, in the low contrast mode, if the contrast in shooting is high enough to perform phase difference detection AF, hybrid AF is performed. On the other hand, if the contrast in shooting is not high enough to perform phase difference detection AF, contrast detection AF is performed.

In this embodiment, first, it is determined whether or not a focus state can be detected by a phase difference detection method based on an output of the line sensor 24a of the phase difference detection unit 20 so that one of hybrid AF and contrast detection AF is selected. However, the present invention is not limited to this process. For example, the following configuration may be employed. Specifically, after the release button 40b has been pressed halfway down and before a phase difference focal point is detected (i.e., between Steps Sg5 and Sg6 in FIG. 19), a contrast value may be obtained based on an output of the imaging device 10 so as to determine whether or not the contrast value obtained from the output of the imaging device 10 is larger than a predetermined value. Here, the predetermined value is set at a contrast value large enough to detect the positions of object images formed on the line sensor 24a. Specifically, if the contrast value obtained from the output of the imaging device 10 is larger than or equal to a value at which a focus state can be detected by the phase difference detection method, hybrid AF may be performed. If the contrast value obtained from the output of the imaging device 10 is smaller than the value at which a focus state can be detected by the phase difference detection method, contrast detection AF may be performed.

In this embodiment, if a focus state can be detected by the phase difference detection method, hybrid AF is performed. Alternatively, in this case, phase difference detection AF may be performed, instead.

In this manner, in the camera 100 including the imaging unit 1 in which light which has passed through the imaging device 10 is received by the phase difference detection unit 20, phase difference detection AF (including hybrid AF) and contrast detection AF can be performed without a conventional movable mirror for guiding light to the phase difference detection unit. As a result, highly accurate focusing performance can be achieved by selecting phase difference detection AF or contrast detection AF according to the contrast -AF Switching According to Type of Interchangeable Lenses- The camera 100 of this embodiment is configured to switch the type of autofocus according to the type of the interchangeable lenses 7 attached to the camera body 4.

Figure 20:
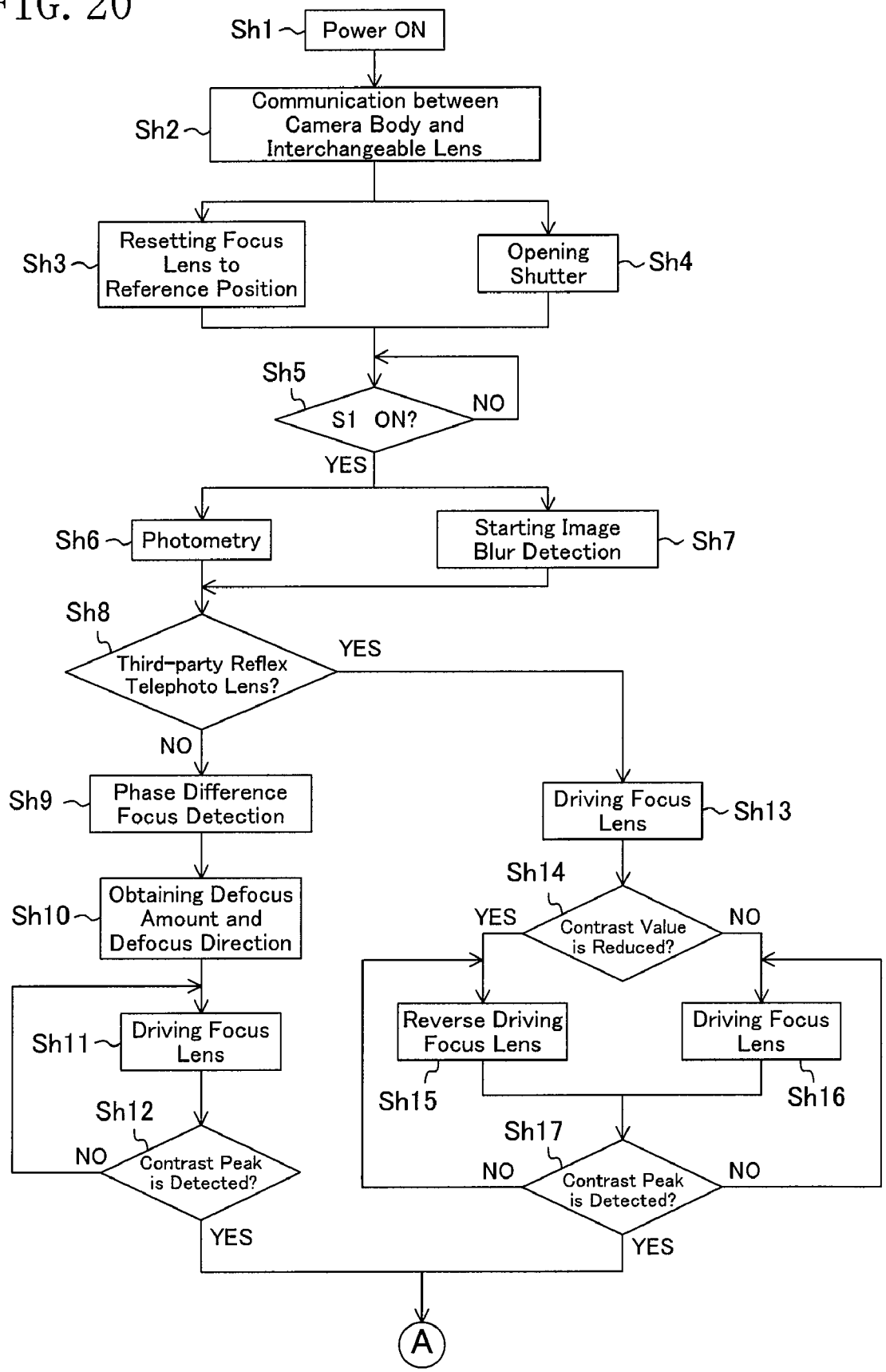
FIG. 20 is a flowchart showing a flow in shooting operation in which AF function is switched according to the type of interchangeable lenses before the release button is pressed all the way down.

AF switching function according to the type of the interchangeable lenses will be described hereinafter with reference to FIG. 20. The following description is directed to hybrid AF. However, the AF switching function according to the type of the interchangeable lenses is not limited to hybrid AF, and may be applied to any operation such as phase difference detection AF, contrast detection AF, phase difference detection AF of the variation, and hybrid AF of the variation.

Steps (i.e., Steps Sh1-Sh5) from the step in which the power switch 40a is turned on to the step in which the body microcomputer 50 remains in a standby state until the release button 40b is pressed halfway down are the same as Steps Sa1-Sa5 in phase difference detection AF.

When the release button 40b is pressed halfway down by the user (Step Sh5), photometry is performed (Step Sh6), and in parallel to Step Sh6, image blur detection is started (Step Sh7). Steps Sh6 and Sh7 are the same as Steps Sa9 and Sa10 in phase difference detection AF. The photometry and the image blur detection may be performed in parallel to autofocus, which will be described later.

Thereafter, based on information from the lens microcomputer 80, the body microcomputer 50 determines whether or not the interchangeable lenses 7 are third-party reflex telephoto lenses or smooth transition focus (STF) lenses (Step Sh8). If the interchangeable lenses 7 are third-party reflex telephoto lenses or STF lenses (i.e., YES), the process proceeds to Step Sh13, and contrast detection AF is performed. Steps Sh13-Sh17 are the same as Steps Sb6-Sb10 in contrast detection AF.

If the interchangeable lenses 7 are neither third-party reflex telephoto lenses nor STF lenses (i.e., NO), the process proceeds to Step Sh9, and hybrid AF is performed. Steps Sh9-Sh12 are the same as Steps Sc6, Sc7, Sc10, and Sc11 in hybrid AF.

After contrast detection AF or hybrid AF has been performed in the above-described manner, the process proceeds to step Sa11.

In Step Sa11, the body microcomputer 50 remains in a standby state until the release button 40b is pressed all the way down by the user. A flow of steps after the release button 40b is pressed all the way down is the same as that of hybrid AF.

Specifically, if the interchangeable lenses 7 are third-party reflex telephoto lenses or STF lenses, phase difference detection might not be performed with accuracy. Thus, hybrid AF (specifically, phase difference detection AF) is not performed, and contrast detection AF is performed. On the other hand, if the interchangeable lenses 7 are neither third-party reflex telephoto lenses nor STF lenses, hybrid AF is performed. More specifically, the body microcomputer 50 determines whether coincidence of the optical axes of the interchangeable lenses 7 sufficient for performing phase difference detection AF is ensured or not. Hybrid AF is performed only for the interchangeable lenses 7 in which coincidence of the optical axes thereof sufficient for performing phase difference detection AF is ensured. On the other hand, contrast detection AF is performed for the interchangeable lenses 7 in which coincidence of the optical axes thereof sufficient for performing phase difference detection AF is not ensured.

As described above, in the camera 100 including the imaging unit 1 in which light passing through the imaging device 10 is received by the phase difference detection unit 20, phase difference detection AF (including hybrid AF) and contrast detection AF can be performed without a conventional movable mirror for guiding light to the phase difference detection unit. As a result, highly accurate focusing performance can be achieved by selecting phase difference detection AF or contrast detection AF according to the type of the interchangeable lenses 7.

In this embodiment, one of hybrid AF and contrast detection AF is selected by determining whether or not the interchangeable lenses 7 are third-party reflex telephoto lenses or STF lenses. However, the present invention is not limited to this configuration. One of hybrid AF and contrast detection AF may be selected by determining whether the interchangeable lenses 7 are third-party lenses or not, irrespective of whether or not the interchangeable lenses 7 are reflex telephoto lenses or STF lenses.

In this embodiment, hybrid AF is performed if the interchangeable lenses 7 are neither third-party reflex telephoto lenses nor STF lenses. Alternatively, in this case, phase difference detection AF may be performed, instead.

Third Embodiment

Now, a camera as an imaging apparatus as an imaging apparatus according to a third embodiment of the present invention will be described.

Figure 21:
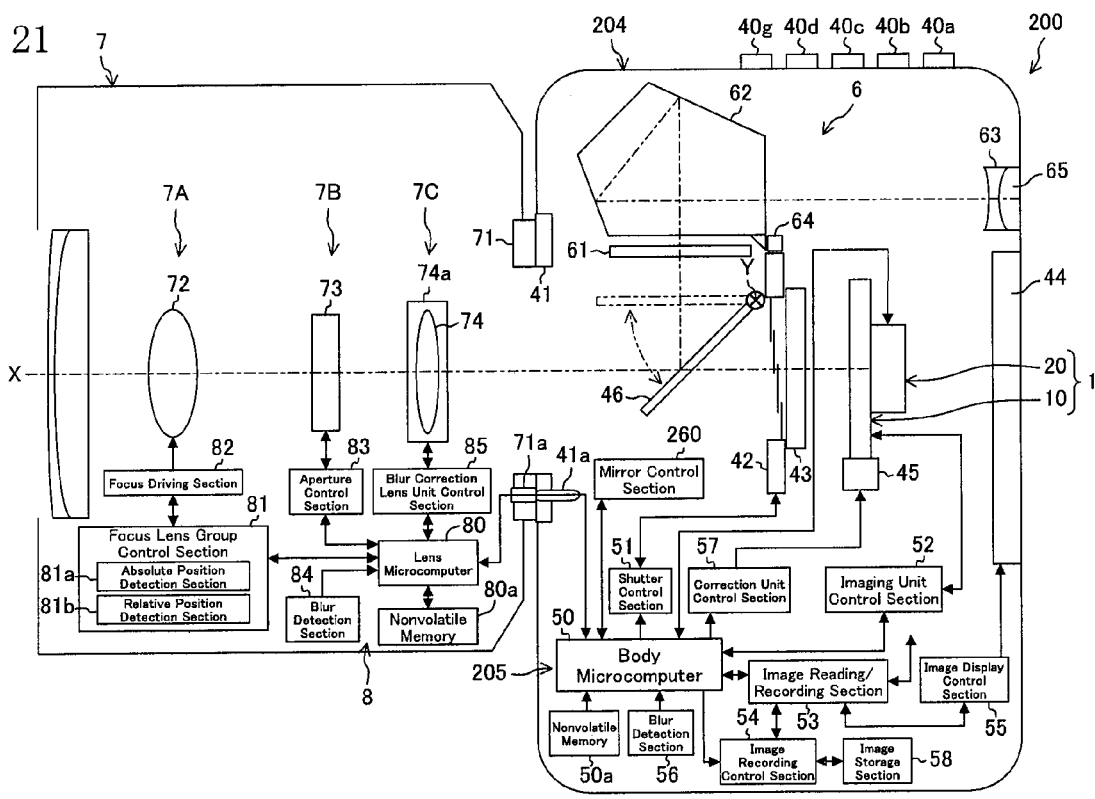
FIG. 21 is a block diagram of a camera according to a third embodiment of the present invention.

As illustrated in FIG. 21, a camera 200 according to the third embodiment includes a finder optical system 6.

-Configuration of Camera Body-

In addition to the configuration of the camera body 4 of the second embodiment, a camera body 204 includes: the finder optical system 6 for visually identifying an object image through a finder 65; and a semi-transparent quick return mirror 46 for guiding light entering from interchangeable lenses 7 to the finder optical system 6.

The camera body 204 has a finder shooting mode in which shooting is performed with an object image visually identified through the finder optical system 6 and a live view shooting mode in which shooting is performed with an object image visually identified through an image display section 44. The camera body 204 includes a finder-mode setting switch 40g. The camera body 204 is set in the finder shooting mode by turning the finder-mode setting switch 40g on, and is set in the live view shooting mode by turning the finder-mode setting switch 40g off.

The finder optical system 6 includes: a finder screen 61 on which light reflected on the quick return mirror 46 is formed into an image; a pentaprism 62 for converting an object image projected on the finder screen 61 into an erect image; an eyepiece 63 for visually identifying the projected object image in an enlarged manner; an in-finder display section 64 for displaying various information in the field of view of the finder; and the finder 65 provided at the back side of the camera body 204.

That is, an object image formed on the finder screen 61 can be observed from the finder 65 through the pentaprism 62 and the eyepiece 63.

In addition to the configuration of the body control section 5 of the second embodiment, a body control section 205 includes a mirror control section 260 for controlling flip-up operation of the quick return mirror 46, which will be described later, based on a control signal from the body microcomputer 50.

The quick return mirror 46 is a semi-transparent mirror capable of reflecting or transmitting incident light, is located in front of the shutter unit 42, and is configured to be rotatable between the reflection position (indicated by the solid lines in FIG. 21) on an optical path X extending from an object to the imaging unit 1 and a retreat position (indicated by the chain double-dashed lines in FIG. 21) which is located out of the optical path X and close to the finder optical system 6. At the reflection position, the quick return mirror 46 divides incident light into reflected light reflected toward the finder optical system 6 and transmitted light transmitted toward the back side of the quick return mirror 46.

Specifically, the quick return mirror 46 is disposed in front of the shutter unit 42 (i.e., closer to an object), and is supported to be rotatable about the axis Y extending horizontally in front of an upper portion of the shutter unit 42. The quick return mirror 46 is flipped toward the retreat position by a bias spring (not shown). In addition, the quick return mirror 46 is moved to the reflection position by winding the bias spring with a motor (not shown) for opening/closing the shutter unit 42. The quick return mirror 46 which has been moved to the reflection position is locked in the reflection position with, for example, an electromagnet. When this locked state is canceled, the quick return mirror 46 is moved, while rotating, to the retreat position by the force of the bias spring.

That is, to guide part of incident light to the finder screen 61, the bias spring is wound with the motor, and thereby, the quick return mirror 46 is moved to the reflection position. On the other hand, to guide all the incident light to the imaging unit 1, a locked state with, for example, an electromagnet is canceled, and thereby, the quick return mirror 46 is moved, while rotating, to the retreat position by the elastic force of the bias spring.

As illustrated in FIG. 22, the quick return mirror 46 is coupled to a light shield plate 47. The light shield plate 47 operates in synchronization with the quick return mirror 46.

When the quick return mirror 46 is in the retreat position, the light shield plate 47 covers the quick return mirror 46 from below the quick return mirror 46 (i.e., from the side of the quick return mirror 46 toward the optical path X extending from an object to the imaging unit 1). Thus, it is possible to prevent light entering from the finder optical system 6 from reaching the imaging unit 1 when the quick return mirror 46 is in the retreat position.

Specifically, the light shield plate 47 includes a first light shield plate 48 rotatably coupled to an end of the quick return mirror 46 opposite to the rotation axis Y and a second light shield plate 49 rotatably coupled to the first light shield plate 48. The first light shield plate 48 has a first cam follower 48a. On the other hand, the camera body 204 has a first cam groove 48b with which the first cam follower 48a is engaged. The second light shield plate 49 has a second cam follower 49a. On the other hand, the camera body 204 has a second cam groove 49b with which the second cam follower 49a is engaged.

That is, when the quick return mirror 46 is rotated, the first light shield plate 48 follows the quick return mirror 46 to move, and the second light shield plate 49 follows the first light shield plate 48 to move. At this time, the first and second light shield plates 48 and 49 move in synchronization with the quick return mirror 46 with the first and second cam followers 48a and 49a respectively guided by the first and second cam grooves 48b and 49b.

Consequently, when the quick return mirror 46 is in the retreat position, the first and second light shield plates 48 and 49 are disposed to form a single flat plate below the quick return mirror 46, as illustrated in FIG. 22(A), and block light between the quick return mirror 46 and the shutter unit 42, i.e., the imaging unit 1. At this time, as the quick return mirror 46 is, the first and second light shield plates 48 and 49 are located out of the optical path X. Accordingly, the first and second light shield plates 48 and 49 do not affect light entering the imaging unit 1 from an object.

As the quick return mirror 46 moves from the retreat position to the reflection position, the first and second light shield plates 48 and 49 gradually bend from the flat plate state, as illustrated in FIG. 22(B). Then., when the quick return mirror 46 is rotated to the reflection position, the first and second light shield plates 48 and 49 bend to face each other, as illustrated in FIG. 22(C). At this time, the first and second light shield plates 48 and 49 are located out of the optical path X, and at the side opposite the finder screen 61 with the optical path X sandwiched therebetween. Accordingly, when the quick return mirror 46 is in the reflection position, the first and second light shield plates 48 and 49 do not affect light reflected from the quick return mirror 46 to the finder optical system 6 and light transmitted through the quick return mirror 46.

As described above, the quick return mirror 46 is made semi-transparent, and the light shield plate 47 is provided. Thus, in the finder shooting mode, it is possible to visually identify an object image with the finder optical system 6, while allowing light to reach the imaging unit 1, before shooting. During the shooting, it is possible to prevent light entering from the finder optical system 6 from reaching the imaging unit 1 with the light shield plate 47, while guiding light from the object to the imaging unit 1. In the live view shooting mode, the light shield plate 47 can prevent light entering from the finder optical system 6 from reaching the imaging unit 1.

-Operation of Camera-

The camera 200 configured as described above has two shooting modes, i.e., a finder shooting mode and a live view shooting mode, which differ from each other in visually identifying an object. Operation of the camera 200 in each of the two shooting modes will be described hereinafter.

-Finder Shooting Mode-

Figure 23:
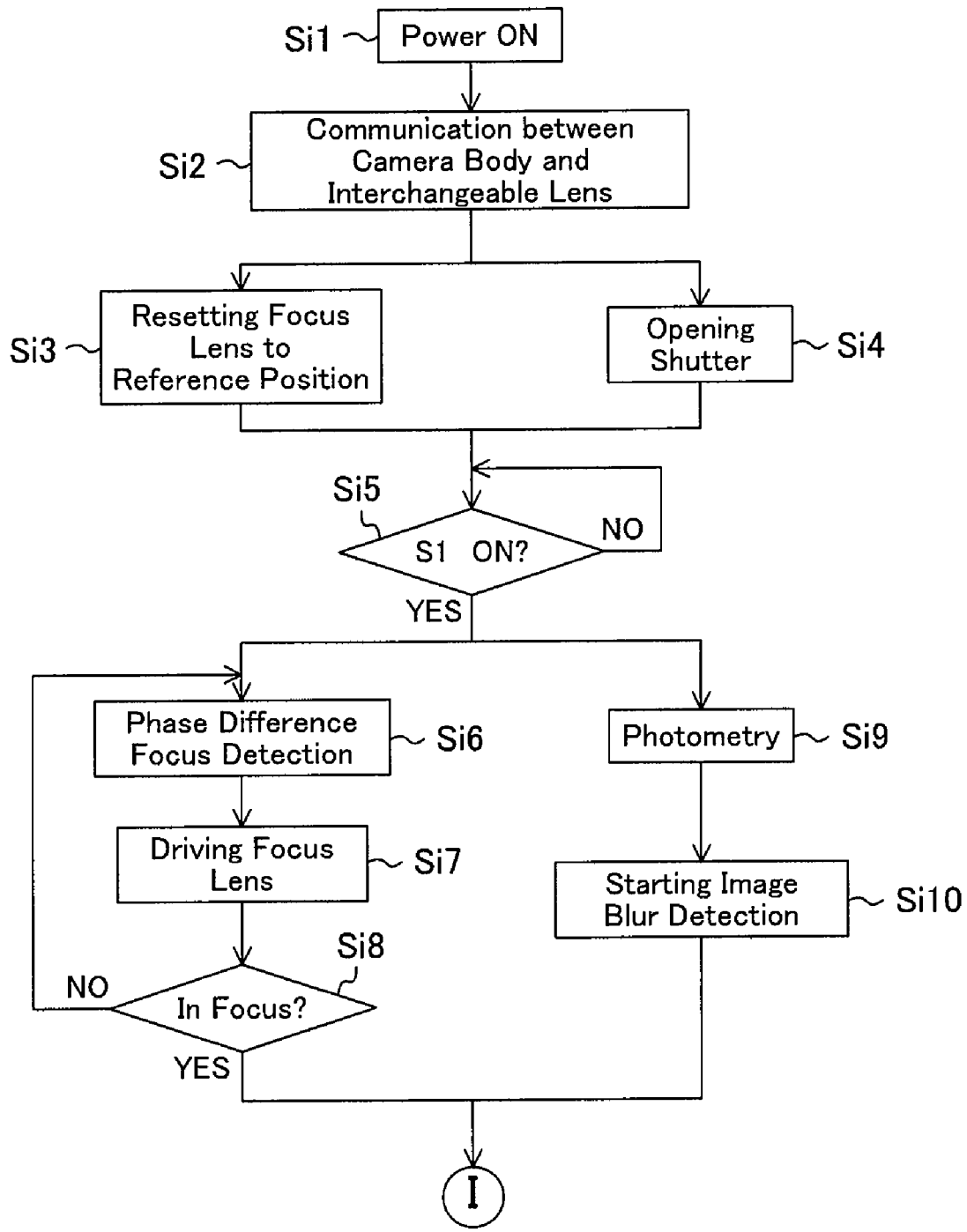
FIG. 23 is a flowchart showing a flow in a finder shooting mode before the release button is pressed all the way down.
Figure 24:
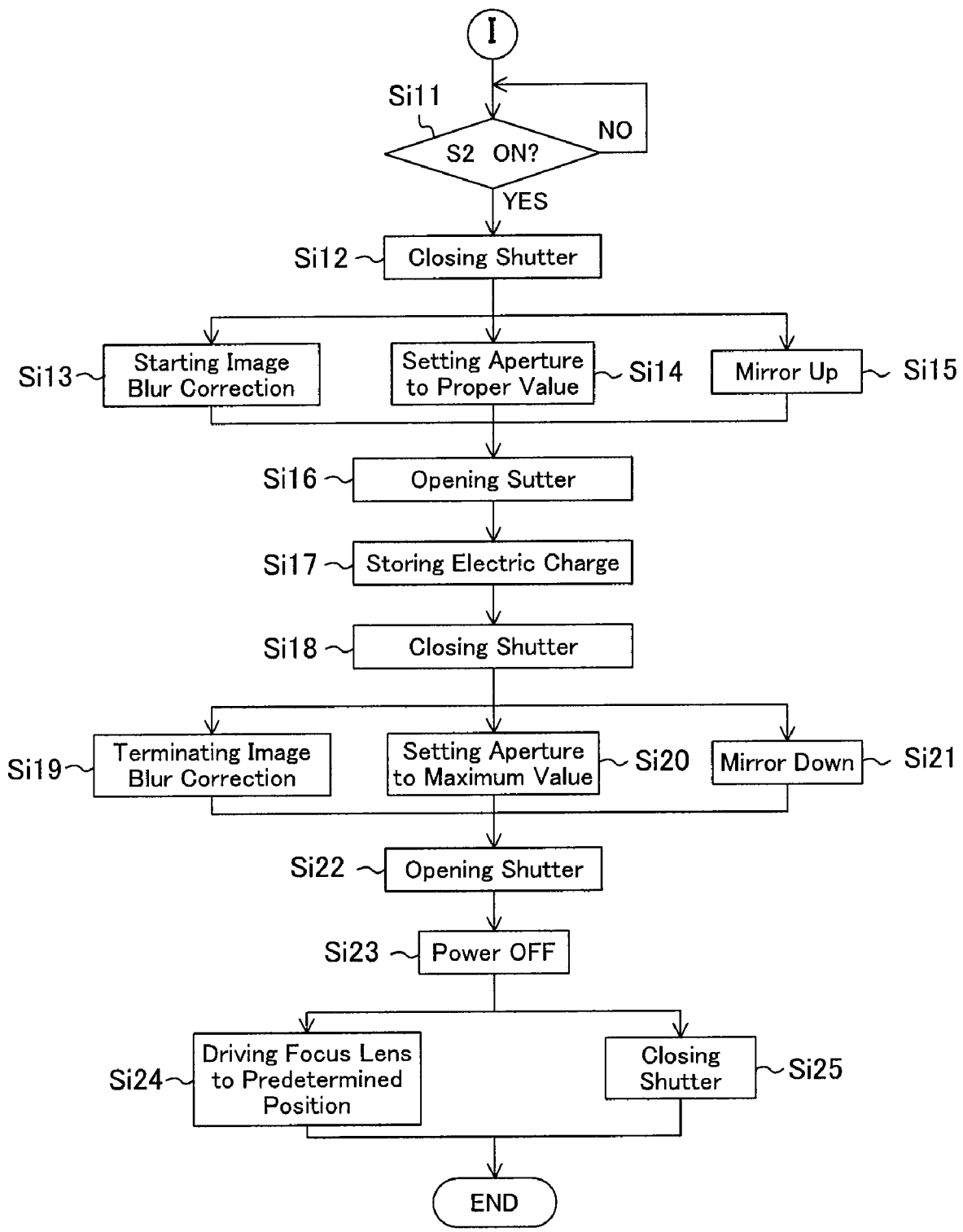
FIG. 24 is a flowchart showing a flow in the finder shooting mode after the release button is pressed all the way down.

First, shooting operation of the camera system in the finder shooting mode will be described hereinafter with reference to FIGS. 23 and 24.

Steps in which the power switch 40a is turned on (Step Si1), the release button 40b is pressed halfway down by the user (Step Si5), the release button 40b is pressed all the way down by the user (Step Si11), and then the shutter unit 42 is once put into a closed state (Step Si12) are basically the same as Steps Sa1-Sa12 in phase difference detection AF of the second embodiment.

Note that when the power switch 40a is turned on, the quick return mirror 46 is in the reflection position on the optical path X. Accordingly, light which has entered the camera body 204 is partially reflected, to enter the finder screen 61.

Light which has entered the finder screen 61 is formed as an object image. This object image is converted into an erect image by the pentaprism 62, and enters the eyepiece 63. That is, unlike the second embodiment in which an object image is displayed on the image display section 44, the user can observe an erect image of an object through the eyepiece 63. At this time, the image display section 44 displays not an object image but various information on shooting.

When the release button 40b is pressed halfway down by the user (Step Si5), various information (e.g., information on AF and photometry, which will be described later) on shooting are displayed on the in-finder display section 64 observed through the eyepiece 63. That is, the user can see various information on shooting with the in-finder display section 64 as well as the image display section 44.

Since the quick return mirror 46 is semi-transparent, part of light which has entered the camera body 204 is guided to the finder optical system 6 by the quick return mirror 46, but the other part of the light is transmitted through the quick return mirror 46 to enter the shutter unit 42. Then, when the shutter unit 42 is put into an open state (Step Si4), light transmitted through the quick return mirror 46 enters the imaging unit 1. Consequently, it is possible to perform autofocus (Steps Si6-Si8) and photometry (Step Si9) with the imaging unit 1, while enabling visual identification of an object image through the finder optical system 6.

Specifically, in Steps Si6-Si8, phase difference detection AF is performed based on an output from the phase difference detection unit 20 of the imaging unit 1, and in parallel to the phase difference detection AF, photometry can be performed based on an output from the imaging device 10 of the imaging unit 1 in Step Si9.

In detection of a phase difference focal point in Step Si6, since object image light is transmitted through the quick return mirror 46, the optical length is increased by the value corresponding to the thickness thereof. Accordingly, the phase detection width of the phase difference focal point detection section differs between a case where the quick return mirror 46 retreats from the position on the object image optical path to a shooting state and a case where the quick return mirror 46 is in the reflection position. Thus, in the finder shooting mode in which the quick return mirror 46 is placed on the object image optical path, defocus information is output with a phase detection width changed by a predetermined value from the phase detection width in phase difference focal point detection of the first embodiment (i.e., the phase detection width in phase difference focal point detection in hybrid AF in the live view shooting mode, which will be described later). The phase detection width is a phase difference as a reference for calculating that a defocus amount is 0 (zero), i.e., determining that an object image is in focus.

Steps Si6-Si8 in which phase difference detection AF is performed are the same as Steps Sa6-Sa8 in phase difference detection AF of the second embodiment.

In Step Si9, the imaging device 10 measures the amount of light entering the imaging device 10. In this embodiment, not all of light from an object enters the imaging device 10, unlike the second embodiment. Thus, the body microcomputer 50 corrects an output from the imaging device 10 based on reflection properties of the quick return mirror 46, and obtains the amount of light from the object.

After the release button 40b is pressed all the way down by the user (Step Si11) and the shutter unit 42 is once put into a closed state (Step Si12), flip-up of the quick return mirror 46 to the retreat position is performed in Step Si15, in parallel to a start of image blur correction (Step Si13) and aperture operation of the aperture section 73 (Step Si14).

Thereafter, in Steps Si16-Si18, exposure is performed in the same manner as in Steps Sa15-Sa17 in phase difference detection AF of the second embodiment.

After the exposure, in parallel to termination of image blur correction (Step Si19) and opening of the aperture section 73 (Step Si20), the quick return mirror 46 is moved to the reflection position in Step Si21. Thus, the user can visually identify an object image again through the finder optical system 6.

Subsequently, the shutter unit 42 is put into an open state (Step Si22). In this manner, when a shooting sequence is terminated after completion of resetting, the process returns to Step Si5, and the body microcomputer 50 is in a standby state until the release button 40b is pressed halfway down.

Steps Si23-Si25 after the power switch 40a is turned off are the same as Steps Sa21-Sa23 in phase difference detection AF of the second embodiment.

As described above, even in the configuration allowing visual identification of an object image through the finder optical system 6 by guiding light from the object to the finder optical system 6 using the quick return mirror 46, since the phase difference detection unit 20 for detecting a phase difference using light which has passed through the imaging device 10 is provided in the imaging unit 1, it is possible to perform visual identification of an object image through the finder optical system 6, while performing phase difference detection AF and photometry in parallel, by forming the quick return mirror 46 to be semi-transparent to allow part of light which has entered the quick return mirror 46 to reach the imaging unit 1. In this manner, it is unnecessary to additionally provide a reflection mirror for phase difference detection AF and a photometry sensor, and in addition, photometry can be performed in parallel to autofocus, thereby reducing a release time lag.

-Live View Shooting Mode-

Figure 25:
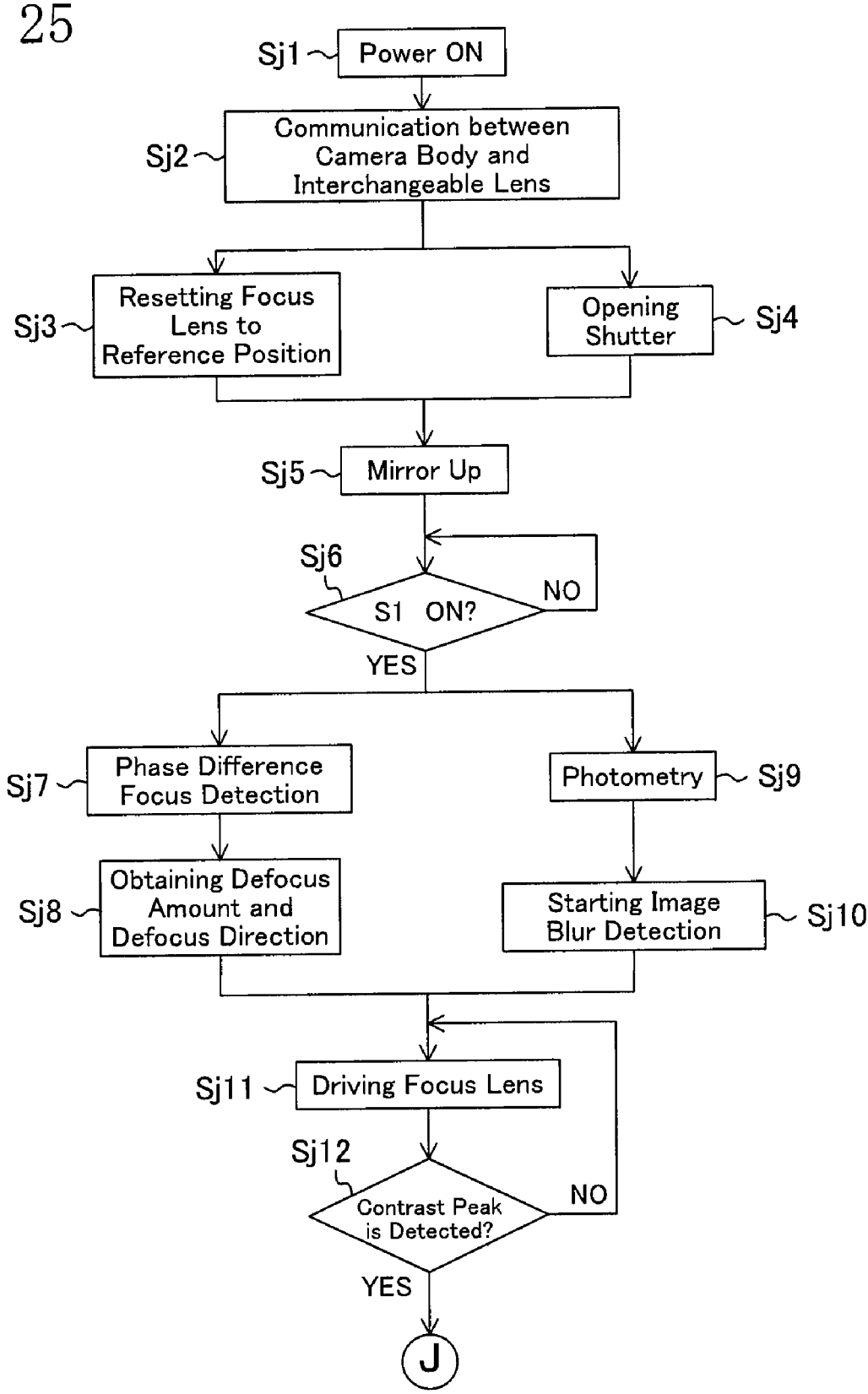
FIG. 25 is a flowchart showing a flow in a live view shooting mode before the release button is pressed all the way down.
Figure 26:
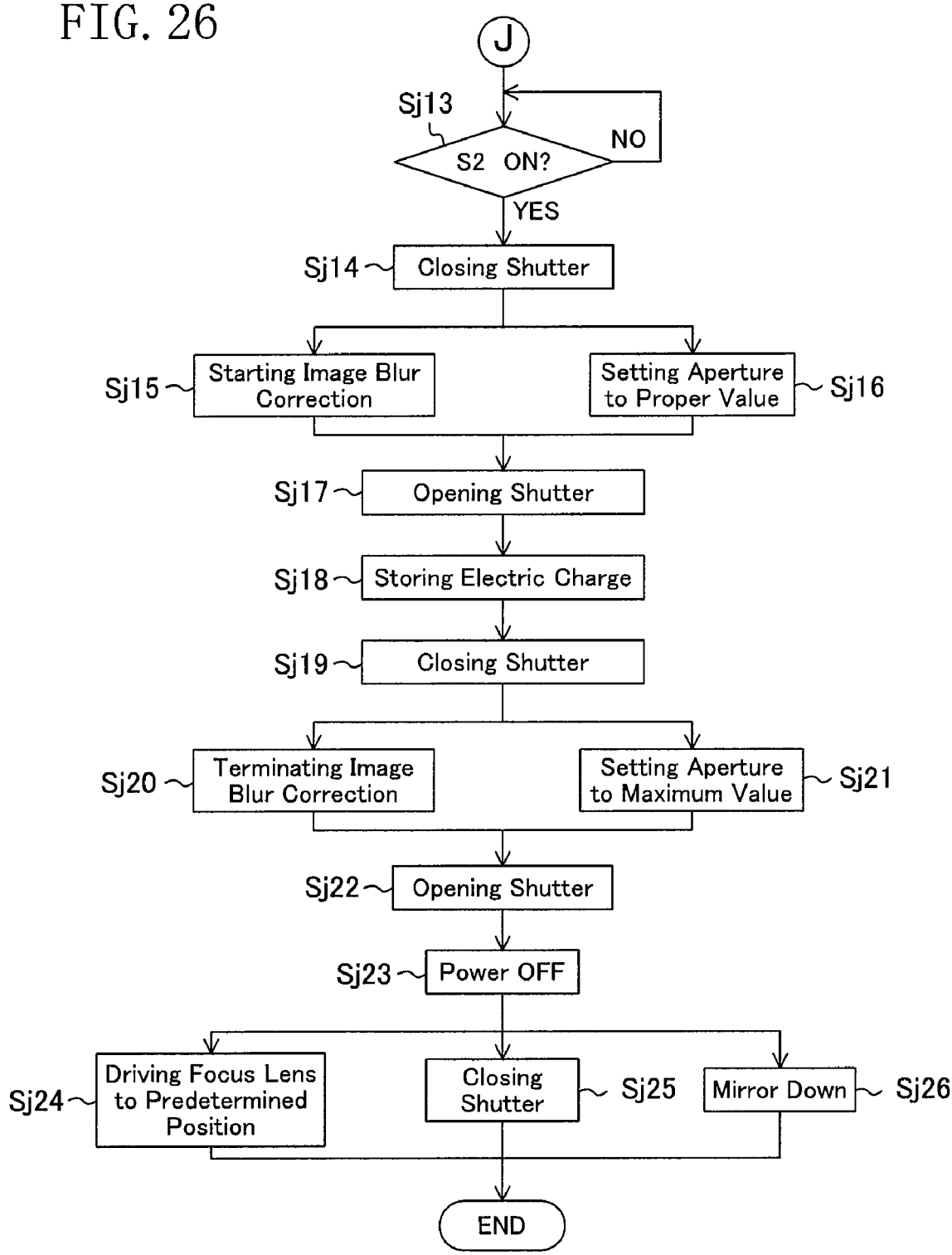
FIG. 26 is a flowchart showing a flow in the live view shooting mode after the release button is pressed all the way down.

Now, shooting operation of the camera system in the live view shooting mode will be described hereinafter with reference to FIGS. 25 and 26.

Step (i.e., Steps Sj1-Sj4) from the step in which the power switch 40a is turned on to the step in which the shutter unit 42 is put into an open state are the same as operation in hybrid AF of the second embodiment.

Here, in the camera 200, immediately after the power switch 40a is turned on, the quick return mirror 46 is in the reflection position. Thus, in Step Sj5, the body microcomputer 50 flips the quick return mirror 46 up to the retreat position.

Consequently, light entering the camera body 4 from an object is not guided to the finder optical system 6, but is transmitted through the shutter unit 42 and then through the OLPF 43 also serving as an IR cutter, and enters the imaging unit 1. An object image formed on the imaging unit 1 is displayed on the image display section 44 so that the user can see the object image through the image display section 44. Part of light which has entered the imaging unit 1 passes through the imaging device 10 to enter the phase difference detection unit 20.

When the release button 40b is pressed halfway down by the user (Step Sj6), hybrid AF is performed, unlike in the finder shooting mode. Steps Sj7, Sj8, Sj11, and Sj12 in hybrid AF are the same as Steps Sc6, Sc7, Sc10, and Sell in hybrid AF of the second embodiment.

The foregoing description is not limited to hybrid AF, and contrast detection AF or phase difference detection AF may be performed.

In parallel to hybrid AF described above, photometry is performed (Step Sj9), and image blur detection is started (Step Sj10). Steps Sj9 and Sj10 are the same as Steps Sc8 and Sc9 in hybrid AF of the second embodiment.

As described above, when the release button 40b is pressed halfway down by the user, various information (e.g., information on AF and photometry) on shooting is displayed on the image display section 44.

Thereafter, steps from the step in which the release button 40b is pressed all the way down by the user (Step Sj13) to the step in which exposure is terminated to complete resetting (Step Sj22) are basically the same as Steps Si11-Si22 in the finder shooting mode, except that the step of moving the quick return mirror 46 to the retreat position after putting the shutter unit 42 into a closed state (corresponding to Step Si15) is not performed, and that the step of moving the quick return mirror 46 to the reflection position after putting the shutter unit 42 into a closed state to terminate exposure (corresponding to Step Si21) is not performed.

In this embodiment, when the power switch 40a is turned off (Step Sj23), the focus lens group 72 is moved to the reference position (Step Sj24), and in parallel to the step of putting the shutter unit 42 into a closed state (Step Sj25), the quick return mirror 46 is moved to the reflection position in Step Sj26. Then, operation of the body microcomputer 50 and other units in the camera body 204, and the lens microcomputer 80 and other units in the interchangeable lens 7 is halted.

Shooting operation of the camera system in the live view shooting mode is the same as shooting operation of the camera 100 of the second embodiment except for operation of the quick return mirror 46. Specifically, although the foregoing description is directed to hybrid AF, various types of shooting operation of the second embodiment may be performed. In such cases, the same advantages can be achieved.

Other Embodiments

The above embodiments may have the following configurations. Specifically, in the third embodiment, the finder optical system 6 is provided. However, the present invention is not limited to this configuration. For example, instead of the finder optical system 6, an electronic view finder (EVF) may be provided. Specifically, a small image display section made of, for example, liquid crystal is disposed at such a position in the camera body 204 that allows an object image to be visually identified through the finder, so as to display image data obtained by the imaging unit 1 on the image display section. Then, even in the absence of the complicated finder optical system 6, shooting can be performed with an image viewed through the finder. This configuration does not need the quick return mirror 46. Shooting operation in this case is the same as in the camera 100 of the second embodiment except that two image display sections are provided.

The second and third embodiments are directed to the configurations in each of which the imaging unit 1 is installed in the camera. However, the present invention is not limited to these configurations. For example, the imaging unit 1 may be installed in a video camera.

An example of shooting operation of a video camera will now be described. When the power switch 40a is turned on, the aperture section and the shutter unit are opened, and an image capturing is started in the imaging device 10 of the imaging unit 1. Then, photometry and WB adjustment are performed to be optimal for a live view display, and a live view image is displayed on the image display section. In this manner, in parallel to imaging by the imaging device 10, a focus state is detected based on an output of the phase difference detection unit 20 incorporated in the imaging unit 1, and the focus lens group is continuously driven in accordance with, for example, motion of an object. In this manner, the camera is in a standby state until a REC button is pressed with display of a live view image and phase difference detection AF continuously performed in the above-described manner. When the REC button is pressed, image data obtained by the imaging device 10 is recorded with phase difference detection AF repeated. Then, a focus state can always be maintained, and in addition, it is unnecessary to perform driving (wobbling) of the focus lens in the optical axis direction to a small degree, unlike a conventional digital video camera, and thus, it is also unnecessary to drive actuator, such as a motor, having a heavy electrical load.

In the above description, when the release button 40b is pressed halfway down by the user (i.e., the S1 switch is turned on), AF is started. Alternatively, AF may be started before the release button 40b is pressed halfway down. In addition, AF does not have to be terminated when it is determined that an object is in focus, and may be continued after it is determined that an object is in focus, or may be continued without determination that an object is in focus. A specific example will be described hereinafter. In FIGS. 11 and 12, after the shutter unit 42 is opened in Step Sa4, phase difference focal point detection in Step Sa6 and driving of the focus lens in Step Sa1 are repeated. In parallel to these steps, determination in Step Say, photometry in Step Sa9, starting of image blur detection in Step Sa 10, and determination in Step Sa11 are performed. Thus, a focus state can be obtained before the release button 40b is pressed halfway down by the user. For example, if the foregoing operation is performed with display of a live view image, the live view image can be displayed in a focus state. In addition, the use of phase difference detection AF allows display of a live view image and phase difference detection AF to be performed together. Such operation may be applied to the camera as an "always AF mode." The state in the "always AF mode" may be switched between on and off.

In the foregoing embodiments, the imaging unit 1 is installed in the camera. However, the present invention is not limited to this configuration. The camera including the imaging unit 1 is an example of cameras in which exposure of an imaging device and phase difference detection by a phase difference detection unit can be simultaneously performed. A camera according to the present invention is not limited thereto, but may have a configuration in which object light is guided to both of an imaging device and a phase difference detection unit by, for example, an optical separation device (e.g., a prism or a semi-transparent mirror) for separating light to the image device. Moreover, a camera in which part of each microlens of an imaging device is used as a separator lens and separator lenses are arranged so that pupil-divided object light can be received at light receiving sections may be employed.

Note that the above-described embodiments are essentially preferable examples which are illustrative and do not limit the present invention, its applications, and the scope of use of the invention.

INDUSTRIAL APPLICABILITY

As described above, the present invention is useful for an imaging apparatus including an imaging device for performing photoelectric conversion.

The invention claimed is:

1. An imaging apparatus, comprising:
    an imaging device including a light receiving section and a substrate on which the light receiving section is provided and which has a through hole, the imaging device being configured to perform photoelectric conversion on received light; and
    a phase difference detection section configured to perform phase difference detection on received light which has passed through the imaging device via the through hole.

2. The imaging apparatus of claim 1, wherein the phase difference detection section includes a separator lens configured to divide light which has passed through the through hole into beams, and a sensor configured to detect a phase difference of the beams divided by the separator lens, the substrate has multiple ones of the through hole, and light which has passed through the multiple ones of the through hole enters the separator lens.

3. The imaging apparatus of claim 1 or 2, wherein the imaging device further includes a color filter associated with the light receiving section, and
    the color filter is not provided in the through hole.

4. The imaging apparatus of claim 3, wherein in the substrate, regions in each of which the light receiving section or the through hole is provided are arranged in rows and columns,
    with four regions adjacent to one another in two rows and two columns being defined as one unit, the light receiving section is provided in each of three regions of the four regions, and the through hole is provided in the other region, and
    color filters associated with different colors are respectively provided in the three regions in each of which the light receiving section is provided.

5. The imaging apparatus of claim 4, wherein colors of the color filters provided in the three regions are red, green, and blue, respectively.

6. The imaging apparatus of claim 5, further comprising a control section configured to generate an image signal based on an output of the imaging device, wherein
    the control section interpolates a signal of a pixel at a position at which the through hole is provided, using an output of the light receiving section which is adjacent to the through hole and in which the green color filter is provided.

7. The imaging apparatus of claim 1 or 2, further comprising a control section configured to generate an image signal based on an output of the imaging device, wherein
    the control section interpolates a signal of a pixel at a position at which the through hole is provided, using an output of the light receiving section adjacent to the through hole.

* * * * *